US008133652B2

(12) United States Patent
Kawahara et al.

(10) Patent No.: US 8,133,652 B2
(45) Date of Patent: Mar. 13, 2012

(54) IMAGE PROCESSING METHOD, AND IMAGE PROCESSOR

(75) Inventors: Shinya Kawahara, Numazu (JP); Yoshihiko Hotta, Mishima (JP); Tomomi Ishimi, Numazu (JP)

(73) Assignee: Ricoh Company, Ltd., Tokyo (JP)

( * ) Notice: Subject to any disclaimer, the term of this patent is extended or adjusted under 35 U.S.C. 154(b) by 1087 days.

(21) Appl. No.: 11/963,313

(22) Filed: Dec. 21, 2007

(65) Prior Publication Data

US 2008/0214391 A1 Sep. 4, 2008

(30) Foreign Application Priority Data

Dec. 26, 2006 (JP) ................................ 2006-349980

(51) Int. Cl.
*G03F 7/00* (2006.01)
*G03F 7/20* (2006.01)
*B41J 2/435* (2006.01)

(52) U.S. Cl. ........ 430/270.1; 430/19; 430/945; 347/225

(58) Field of Classification Search .................. 347/224, 347/225, 232, 236, 237; 430/270.1, 19, 945
See application file for complete search history.

(56) References Cited

U.S. PATENT DOCUMENTS

| | | | | |
|---|---|---|---|---|
| 5,668,589 | A * | 9/1997 | Kuwabara et al. | 347/253 |
| 6,745,007 | B1 * | 6/2004 | Kerek | 455/20 |
| 6,818,591 | B2 * | 11/2004 | Arai et al. | 503/201 |
| 2005/0119122 | A1 | 6/2005 | Sakata et al. | |
| 2006/0054606 | A1 | 3/2006 | Amako | |
| 2006/0221424 | A1 | 10/2006 | Utagawa et al. | |
| 2007/0036039 | A1 | 2/2007 | Kawahara et al. | |
| 2007/0219093 | A1 | 9/2007 | Shimbo et al. | |
| 2007/0225161 | A1 | 9/2007 | Yamamoto et al. | |
| 2007/0225162 | A1 | 9/2007 | Kawahara et al. | |

FOREIGN PATENT DOCUMENTS

| | | | |
|---|---|---|---|
| CN | 1748928 | A | 3/2006 |
| CN | 1840359 | A | 10/2006 |
| EP | 1707382 | A2 | 10/2006 |
| JP | 2596639 | | 1/1997 |
| JP | 2003-127446 | | 5/2003 |

(Continued)

OTHER PUBLICATIONS

May 7, 2008 European search report in connection with corresponding European patent application No. 07 12 4057.

(Continued)

*Primary Examiner* — Amanda C. Walke
(74) *Attorney, Agent, or Firm* — Cooper & Dunham LLP

(57) ABSTRACT

The present invention provides an image processing method which includes at least any one of image recording and image erasing, wherein a light irradiation intensity at a center position of the laser beam irradiated in the image recording is controlled; in the image recording, a first auxiliary line extended by a predetermined distance from a start point of each of image lines constituting an image in the opposite direction from the scanning direction and a second auxiliary line extended by a predetermined distance from an end point of each of the image lines in the scanning direction are prepared, and when the first and second auxiliary lines including an image line are continuously scanned, the image line is scanned with irradiating the laser beam, and the first and the second auxiliary lines are scanned without irradiating the laser beam to thereby record the image.

23 Claims, 12 Drawing Sheets

FOREIGN PATENT DOCUMENTS

| | | |
|---|---|---|
| JP | 2004-265247 | 9/2004 |
| JP | 2004-265249 | 9/2004 |
| JP | 2004-345273 | 12/2004 |
| JP | 2005-238272 | 9/2005 |
| JP | 2006-306063 | 11/2006 |

OTHER PUBLICATIONS

Chinese official action (and English translation thereof) in connection with a counterpart Chinese patent application No. 200710307203.6.

* cited by examiner

IMAGE PROCESSING METHOD, AND IMAGE PROCESSOR

BACKGROUND

1. Technical Field

This disclosure relates to an image processing method that enables reducing damage to a thermally reversible recording medium attributable to repeated recording and erasing of each image and preventing deterioration of the thermally reversible recording medium and also relates to an image processor that can be suitably used for the image processing method.

2. Description of the Related Art

Each image has been so far recorded and erased on a thermally reversible recording medium (hereinafter, may be referred to as "recording medium" or "medium" merely) by a contact method in which the thermally reversible recording medium is heated by making contact with a heat source. For the heat source, in the case of image recording, a thermal head is generally used, and in the case of image erasing, a heat roller, a ceramic heater or the like is generally used.

Such a contact type recording method has advantages in that when a thermally reversible recording medium is composed of a flexible material such as film and paper, an image can be uniformly recorded and erased by evenly pressing a heat source against the thermally reversible recording medium with use of a platen, and an image recording device and an image erasing device can be produced at cheap cost by using components of a conventional thermosensitive printer.

However, when a thermally reversible recording medium incorporates an RF-ID tag as described in Japanese Patent Application Laid-Open (JP-A) Nos. 2004-265247 and 2004-265249, the thickness of the thermally reversible recording medium is naturally thickened and the flexibility thereof is degraded. Therefore, to evenly press a heat source against the thermally reversible recording medium, it needs a high-pressure. Further, when there are convexoconcave or irregularities on the surface of a thermally reversible recording medium, it becomes difficult to record and erase an image using a thermal head or the like. In view of the fact that RF-ID tag enables reading and rewriting of memory information from some distance away from a thermally reversible recording medium in a non-contact manner, a demand arises for thermally reversible recording media as well. The demand is that an image or images be rewritten on such a thermally reversible recording medium from some distance away from the thermally reversible recording medium.

To respond to the demand, a recording method using a non-contact laser is proposed as a method of recording and erasing each image on a thermally reversible recording medium from some distance away from the thermally reversible recording medium when there are convexoconcave or irregularities on the surface thereof.

As such a recording method using a laser, a recording device (laser maker) is proposed of which a thermally reversible recording medium is irradiated with a highly energized laser beam to control the irradiation position. A thermally reversible recording medium is irradiated with a laser beam using the laser marker, the recording medium absorbs light, the light is converted into heat, a phase change is generated on the recording medium by effect of heat, thereby an image can be recorded and erased.

The laser marker is configured to record each image by irradiating a region to be recorded with a laser beam by scanning the laser beam while changing a laser beam irradiation direction by changing a scanning mirror angle with motor actuation. Thus, the scanning speed is decelerated due to acceleration and deceleration operations during a time period from a stopped state of the scanning mirror until the scanning mirror begins to be actuated or during a time period from an actuated state of the scanning mirror until the scanning mirror is stopped. For this reason, at a recording start point (a start point), a recording end point (an end point), and a folding point where the rotational direction of the scanning mirror is changed, the scanning speed of the scanning mirror is lowered, and an excessive amount of energy is applied to these portions. Therefore, there is a problem that a thermally reversible recording medium is damaged by repeatedly recording and erasing an image. Further, when scanning a laser beam using an XY stage instead of a scanning mirror, the scanning speed is decelerated due to acceleration and deceleration operations during a time period from a stopped state of the XY stage until the XY stage begins to be actuated or during a time period from an actuated state of the XY stage until the XY stage is stopped. For this reason, similarly to the case of using a scanning mirror, an excessive amount of energy is applied to a start point and an end point of a recorded image, and there may be cases where the thermally reversible recording medium is damaged.

On these points, even when an excessive amount of energy is applied to a conventional non-reversible heat-sensitive recording medium, this does not become a major problem, however, on a thermally reversible recording medium where each image is repeatedly recorded and erased, there is a large problem that an excessive amount of energy is applied to the same portions to cause damage to the recording medium, and each image cannot be uniformly recorded at high-image density and cannot be uniformly erased due to accumulation of damage.

To solve these problems, for example, Japanese Patent Application Laid-Open (JP-A) No. 2003-127446 describes that when an image is recorded on a thermally reversible recording medium so that record dots overlap each other or when an image is recorded with folding lines, laser irradiation energy is controlled for every imaging points to reduce energy to be given to these portions; and also describes that when straight lines are recorded, local thermal damage is reduced by reducing energy at every certain intervals to thereby prevent deterioration of the thermally reversible recording medium.

Japanese Patent Application Laid-Open (JP-A) No. 2004-345273 describes a technique of reducing energy by multiplying irradiation energy by the following expression in accordance with an angle R where a laser beam angle is changed when an image is recorded using a laser.

$$|\cos 0.5R|^k (0.3<k<4)$$

With use of this technique, it is possible to prevent an excessive amount of energy from being given to overlap portions in line images when an image is recorded using a laser and to prevent deterioration of a recording medium or to maintain an image contrast without excessively reducing the energy.

Further, Japanese Patent Application Laid-Open (JP-A) No. 2006-306063 proposes a recording method in which when a certain image is recorded by irradiating a non-contact type rewrite thermal label with a focused laser beam, a light scanning device is continuously driven without oscillating the laser beam, and only when a trajectory of the laser beam assumed when the laser beam is oscillated (a virtual laser beam) moves at a substantially constant speed, the laser beam is oscillated to scan the laser beam and to record the image on the non-contact type rewrite thermal label.

These conventional recording methods respectively provide a technique in which an excessive amount of thermal energy is not to be applied to a thermally reversible recording medium at overlap portions when recording an image using a laser. However, when a uniform image is recorded at high-density and erased repeatedly by using a highly energized laser, not only a start point, an end point and a folding portion of an image line but also the center portion of a straight line are excessively heated, deformed sites and air bubbles are observed on the surface of the thermally reversible recording medium, and materials themselves each taking a roll of color developing-color erasing properties are thermally decomposed, and these materials cannot exert their sufficient ability. As a result, on the entire image lines including start points, end points, folding portions and straight lines constituting an image, it is impossible to uniformly record the image with high-image density and is impossible to uniformly erase the image on a sufficient level, and as an image processing method that causes less deterioration of a thermally reversible recording medium even when the image is repeatedly recorded and erased, there is much to be desired, and further improvements and developments are still desired.

BRIEF SUMMARY

In an aspect of this disclosure, there is provided an image processing method that enables an image to be uniformly recorded at high-image density and uniformly erased for the entire image lines including start points, end points, folding portions and straight lines constituting an image, enables preventing deterioration of a thermally reversible recording medium by reducing damage attributable to repeated image recording and image erasing and enables shortening a recording time, and an image processor that can be suitably used in the image processing method.

This disclosure includes various other aspects, such as, for example, the following:

<1> An image processing method including any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein a light irradiation intensity $I_1$ at a center position of the laser beam irradiated in the image recording step and a light irradiation intensity $I_2$ on an 80% light energy bordering surface to the total light energy of the irradiated laser beam satisfy the expression, $0.40 \leqq I_1/I_2 \leqq 2.00$; in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

<2> An image processing method including any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image, and at the start point and the end point, each of the image lines is recorded in a state where a scanning speed of the laser beam does not attain a substantially uniform motion.

<3> An image processing method including any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein a laser emitting the laser beam is a $CO_2$ laser; and in the image recording step, when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

<4> An image processing method including any one of recording an image on a thermally reversible recording medium that can reversibly change any one of its transparency and color tone depending on temperature, by irradiating and heating the thermally reversible recording medium with a laser beam, and erasing the image recorded on the thermally reversible recording medium by heating the thermally reversible recording medium, wherein in a light intensity distribution on a cross-section in a substantially perpendicular direction to the proceeding direction of the laser beam irradiated in at least any one of the image recording step and the image erasing step, a light irradiation intensity at a center portion of the irradiated laser beam is equal to or lower than a light irradiation intensity at peripheral portions thereof; in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

<5> The image processing method according to any one of the items <1> to <4>, wherein in any one of the image recording step and the image erasing step, at least one of a temperature of the thermally reversible recording medium and a peripheral temperature thereof is detected to control irradiation conditions of the laser beam to be radiated to the thermally reversible recording medium.

<6> The image processing method according to any one of the items <1> to <5>, wherein a time used to scan the first auxiliary line and the second auxiliary line in a state where the laser beam is not irradiated is 0.2 ms to 5 ms.

<7> The image processing method according to any one of the items <1> to <6>, wherein each of the image lines constituting an image is a line constituting any one of a character, a symbol and a diagram.

<8> The image processing method according to any one of the items <1> to <7>, wherein the thermally reversible recording medium has at least a thermally reversible recording layer on a substrate, and the thermally reversible recording layer reversibly changes any one of its transparency and color tone at between a first specific temperature and a second specific temperature that is higher than the first specific temperature.

<9> The image processing method according to any one of the items <1> to <8>, wherein the thermally reversible recording medium has at least a reversible thermosensitive recording layer on a substrate, and the reversible thermosensitive recording layer contains a resin and an organic low-molecular material.

<10> The image processing method according to any one of the items <1> to <8>, wherein the thermally reversible recording medium has at least a reversible thermosensitive recording layer on a substrate, and the reversible thermosensitive recording layer contains a leuco dye and a reversible developer.

<11> An image processor having at least a laser beam emitting unit, and a light irradiation intensity controlling unit that is placed on a laser beam emitting surface of the laser beam emitting unit and is configured to change a light irradiation intensity of a laser beam, wherein the image processor is used in an image processing method according to any one of the items <1> to <10>.

<12> The image processor according to any one of the item <11>, wherein the light irradiation intensity controlling unit is at least one of a lens, a filter, a mask and a mirror.

A first embodiment of the aforementioned image processing method includes at least any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein a light irradiation intensity $I_1$ at a center position of the laser beam irradiated in the image recording step and a light irradiation intensity $I_2$ on an 80% light energy bordering surface to the total light energy of the irradiated laser beam satisfy the expression, $0.40 \leqq I_1/I_2 \leqq 2.00$; in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

In the image processing method, in the image recording step, the thermally reversible recording medium is irradiated with a laser beam whose light irradiation intensity at the center position in the light intensity distribution is reduced small. Therefore, it differs from the case of using a conventional laser beam having a Gauss distribution, and it is possible to prevent deterioration of the thermally reversible recording medium attributable to repeated image forming and image erasing and to form a high-contrast image without reducing the size of the image.

Further, in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image. As a result, for example, when the laser beam is scanned by a scanning mirror, the scanning speed of the scanning mirror will not be decelerated at a recording start point (a start point), a recording end point (an end point) and a folding point where a rotational direction of the scanning mirror is changed, and it is possible to prevent an excessive amount of energy from being applied to these points and to reduce deterioration of the thermally reversible recording medium when an image is repeatedly recorded and erased.

Thus, on the entire image lines including start points, end points, folding portions and straight lines constituting an image, it is possible to uniformly record the image with high-image density and uniformly erase the image, and it is possible to reduce damage due to repeated image recording and image erasing.

A second embodiment of the aforementioned image processing method includes at least any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image, and at the start point and the end point, each of the image lines is recorded in a state where a scanning speed of the laser beam does not attain a substantially uniform motion.

The image line is recorded at the start point and the end point of the image line in a state where the scanning speed of a laser beam does not attain a substantially uniform motion. As a result, it is possible to prevent an excessive amount of energy from being applied to the start point and the end point, improve repetitive durability of the thermally reversible recording medium and to shorten a recording time.

A third embodiment of the aforementioned image processing method includes at least any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein a laser emitting the laser beam is a $CO_2$ laser; in the image recording step, when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

In the aforementioned image processing method, a laser emitting the laser beam is a $CO_2$ laser, and such $CO_2$ laser, which has a wavelength of 10,600 nm, is absorbed in polymers (resins) and thus is absorbed in not only a recording layer and a protective layer but also in a substrate. As a result, the entire of the recording medium is heated, the heat accumulation effect is increased, and energy of the laser beam can be efficiently utilized.

A fourth embodiment of the aforementioned image processing method includes at least any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein in a light intensity distribution on a cross-section in a substantially perpendicular direction to the proceeding direction of the laser beam irradiated in at least any one of the image recording step and the image erasing step, a light irradiation intensity at a center portion of the irradiated laser beam is equal to or lower than a light irradiation intensity at peripheral portions thereof; in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

A fourth embodiment of the image processing method of the present invention includes at least any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein in a light intensity distribution on a cross-section in a substantially perpendicular direction to the proceeding direction of the laser beam irradiated in at least any one of the image recording step and the image erasing step, a light irradiation intensity at a center portion of the irradiated laser beam is equal to or lower than a light irradiation intensity at peripheral portions thereof; in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

In the image processing method, in at least any one of the image recording step and the image erasing step, a laser beam having a light irradiation intensity at the center portion of the light irradiation distribution is equal to or lower than a light irradiation intensity at the peripheral portions thereof is irradiated to the thermally reversible recording medium. For this reason, unlike the case where a laser beam having a conventional Gauss distribution is used, deterioration of the thermally reversible recording medium due to repeated image recording and image erasing can be prevented, and a high-contrast image can be formed without necessity of reducing the image in size.

Further, in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image. As a result, for example, when a laser beam is scanned with a scanning mirror, the scanning speed of the scanning mirror is not decelerated at recording start points (start points), recording end points (end points) and folding points where the rotational direction of the scanning mirror is changed, and it is possible to prevent an excessive amount of energy from being applied to these points and to reduce deterioration of the thermally reversible recording medium due to repeated image recording and image erasing.

Thus, in the aforementioned image processing method, on entire image lines including start points, end points, folding points and straight portions constituting an image, the image processing method can achieve uniform image recording at high-image density and uniform image erasing and can reduce damage due to repeated image recording and image erasing.

The aforementioned image processor is used in the aforementioned image processing method according to any one of the first to fourth embodiments and has at least a laser beam emitting unit and a light irradiation intensity controlling unit that is placed on a laser emitting surface of the laser beam emitting unit and is configured to change a light irradiation intensity of the laser beam.

In the image processor, the laser beam emitting unit emits a laser beam. The light irradiation intensity controlling unit changes a light irradiation intensity of the laser beam emitted from the laser beam emitting unit. As a result, when an image is repeatedly recorded and erased on the thermally reversible recording medium, deterioration of the thermally reversible recording medium due to the repeated recording and erasing can be efficiently prevented.

BRIEF DESCRIPTION OF THE SEVERAL VIEWS OF THE DRAWINGS

FIG. 3A right view is an illustration showing an erased state after the image recording as shown in FIG. 3A left view and image erasing are repeatedly performed.

FIG. 3B right view is an illustration showing an erased state after the image recording as shown in FIG. 3B left view and image erasing are repeatedly performed.

FIG. 9 right view is an illustration showing an erased state after the image recording as shown in FIG. 9 left view and image erasing are repeatedly performed.

Figure 1A:
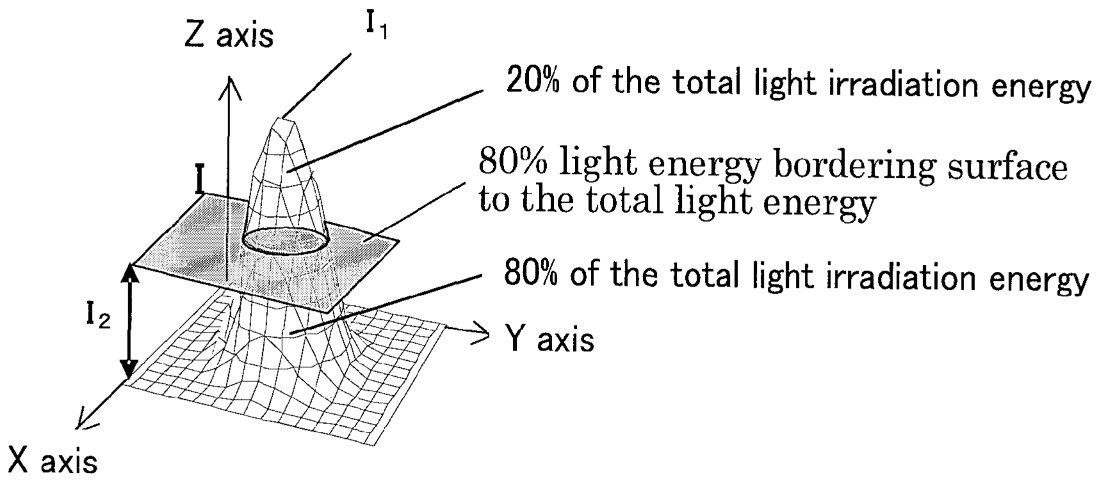
FIG. 1A is a schematic illustration showing one example of a light intensity distribution of an irradiated laser beam used in the present invention.

DETAILED DESCRIPTION OF THE INVENTION (Image Processing Method)

An image processing method according to any one of the first embodiment to the fourth embodiment of the present invention includes at least one of an image recording step and an image erasing step and further include other steps suitably selected in accordance with necessity.

The image processing method of the present invention contains all the aspects including an aspect in which both image recording and image erasing are performed, an aspect in which only image recording is performed, and an aspect in which only image erasing is performed.

In the image processing method according to the first embodiment of the present invention, a light irradiation intensity $I_1$ at a center position of the laser beam irradiated in the image recording step and a light irradiation intensity $I_2$ on an 80% light energy bordering surface to the total light energy of the irradiated laser beam satisfy the expression, $0.40 \leqq I_1/I_2 \leqq 2.00$; in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

In the image processing method according to the second embodiment of the present invention, in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image, and at the start point and the end point, each of the image lines is recorded in a state where a scanning speed of the laser beam does not attain a substantially uniform motion.

In the image processing method according to the third embodiment of the present invention, a laser emitting the laser beam is a $CO_2$ laser; in the image recording step, when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

In the image processing method according to the fourth embodiment of the present invention, in a light intensity distribution on a cross-section in a substantially perpendicular direction to the proceeding direction of the laser beam irradiated in at least any one of the image recording step and the image erasing step, a light irradiation intensity at a center portion of the irradiated laser beam is equal to or lower than a light irradiation intensity at peripheral portions thereof; in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

<Image Recording Step and Image Erasing Step>

The image recording step in the image processing method according to any one of the first embodiment to the fourth embodiment of the present invention is a step in which a thermally reversible recording medium that can reversibly change any one of its transparency and color tone depending on temperature is irradiated and heated with a laser beam to thereby record an image on the thermally reversible recording medium.

The image erasing step in the image processing method of the present invention is a step in which the image recorded on the thermally reversible recording medium is erased by heating the thermally reversible recording medium.

The image erasing step in the image processing method of the present invention is a step in which the image recorded on the thermally reversible recording medium is erased by heating the thermally reversible recording medium with a laser beam.

In the image erasing step of the image processing method in the present invention, images recorded on the thermally reversible recording medium are erased by heating the thermally reversible recording medium, and as a heat source, a laser beam may be used or other heat sources other than laser beam may be used. Among a variety of heat sources, when the thermally reversible recording medium is irradiated with a laser beam to heat the thermally reversible recording medium and an image recorded on the thermally reversible recording medium is erased in a short time, it is preferable to use an infrared lamp, a heat roller, a hot stamp, a drier or the like to heat it because it takes some time to scan the thermally reversible recording medium with a single laser beam to irradiate the entire given area. Further, when the thermally reversible recording medium is attached to a styrofoam box as a conveyance container used in a logistical line and the styrofoam box itself is heated, the styrofoam box is melted, and thus it is preferable that only the thermally reversible recording medium be irradiated with a laser beam to locally heat thereof.

By irradiating and heating the thermally reversible recording medium with the laser beam, an image can be recorded and erased in a non-contact manner on the thermally reversible recording medium.

Note that in the image processing method of the present invention, generally, an image recorded on the thermally reversible recording medium is updated (the image erasing step) for the first time when the thermally reversible recording medium is reused, and thereafter, an image is recorded according to the image recording step, however, the order of image recording and image erasing is not limited thereto, and an image may be recorded according to the image recording step and then the recorded image may be erased according to the image erasing step.

In the image processing method according to any one of the first embodiment to the fourth embodiment of the present invention, in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image. With this configuration, the scanning speed of a laser beam (for example, a scanning speed of a scanning mirror) is not decelerated during irradiation of the laser beam, and thus it is possible to prevent an excessive amount of energy from being applied to the thermally reversible recording medium and to reduce deterioration of the thermally reversible recording medium even when image recording and image erasing are repeatedly performed on the thermally reversible recording medium, and the repetitive durability of the thermally reversible recording medium can be improved.

Each of image lines constituting the image is preferably a line constituting any one of a character, a symbol and a diagram.

The distance (length) of the first auxiliary line and the distance (length) of the second auxiliary line are not particularly limited and may be suitably adjusted in accordance with the intended use. Further, the first auxiliary line and the second auxiliary line may be looped, folded, or may be combined to another auxiliary line or another image line.

The time used to scan the first auxiliary line and the second auxiliary line without irradiating a laser beam is preferably 0.2 ms to 5 ms, and more preferably 0.3 ms to 2 ms. When the time is less than 0.2 ms, the first and the second auxiliary lines are irradiated with a laser beam in a state where the scanning speed of the laser beam is substantially slow, and thus an excessive amount of energy is applied to start points, end points etc. of recorded image lines, resulting in damage to the thermally reversible recording medium. When the scanning time is more than 5 ms, the image may not be recorded within a desired time length due to elongated recording time.

Figure 3A:
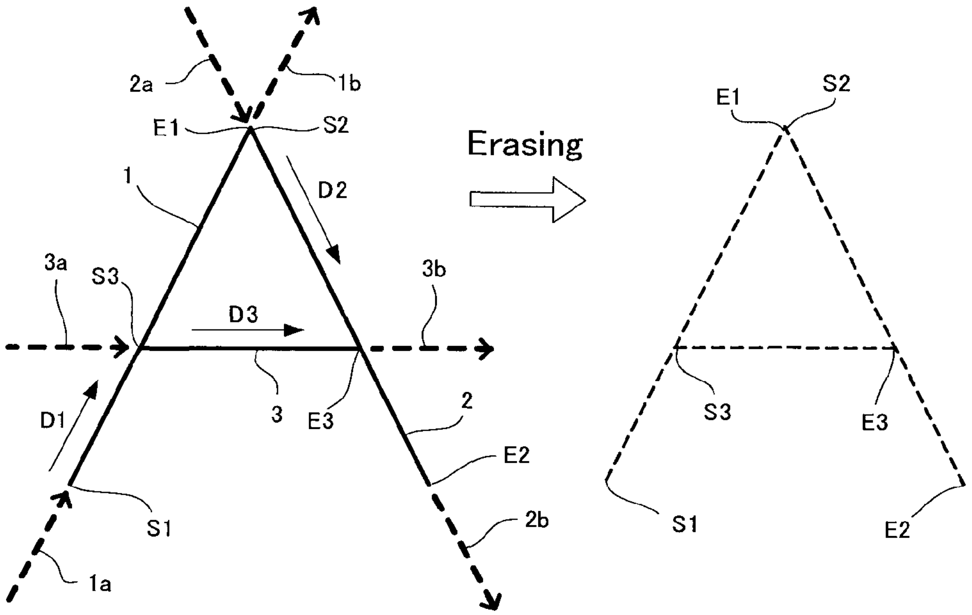
FIG. 3A left view is an illustration showing one example of a method of recording a character "A" according to the image recording step in the image processing method of the present invention.

Here, FIG. 3A left view shows one example of a method of recording a character "A" according to the image recording step in the image processing method of the present invention. As shown in FIG. 3A left view, a first auxiliary line 1*a* extended by a predetermined distance from a start point S1 of an image line 1 in the opposite direction from a scanning direction D1 and a second auxiliary line 1*b* extended by a predetermined distance from an end point E1 of the image line 1 in the scanning direction D1 are prepared, and when the first auxiliary line 1*a* and second auxiliary line 1*b* including the image line 1 are continuously scanned from the start point of the first auxiliary line 1*a* to the end point of the second auxiliary line 1*b*, the image line 1 is scanned with irradiating the laser beam, and the first auxiliary line 1*a* and the second auxiliary line 1*b* are scanned without irradiating the laser beam to thereby record the image. As a result, as shown in FIG. 3A right view, the scanning speed of a scanning mirror is not decelerated at the start point S1 and the end point E1, and it is possible to prevent an excessive amount of energy from being applied to the start point S1 and the end point E1 and to reduce deterioration of the thermally reversible recording medium when an image is repeatedly recorded and erased.

Next, as shown in FIG. 3A left view, a first auxiliary line 2*a* extended by a predetermined distance from a start point S2 of an image line 2 in the opposite direction from a scanning direction D2 and a second auxiliary line 2*b* extended by a predetermined distance from an end point E2 of the image line 2 in the scanning direction D2 are prepared, and when the first auxiliary line 2*a* and second auxiliary line 2*b* including the image line 2 are continuously scanned from the start point of the first auxiliary line 2*a* to the end point of the second auxiliary line 2*b*, the image line 2 is scanned with irradiating the laser beam, and the first auxiliary line 2*a* and the second auxiliary line 2*b* are scanned without irradiating the laser beam to thereby record the image. As a result, as shown in FIG. 3A right view, the scanning speed of the scanning mirror is not decelerated at the start point S2 and the end point E2, and it is possible to prevent an excessive amount of energy from being applied to the start point S2 and the end point E2 and to reduce deterioration of the thermally reversible recording medium when an image is repeatedly recorded and erased.

Next, as shown in FIG. 3A left view, a first auxiliary line 3*a* extended by a predetermined distance from a start point S3 of an image line 3 in the opposite direction from a scanning direction D3 and a second auxiliary line 3*b* extended by a predetermined distance from an end point E3 of the image line 3 in the scanning direction D3 are prepared, and when the first auxiliary line 3*a* and second auxiliary line 3*b* including the image line 3 are continuously scanned from the start point of the first auxiliary line 3*a* to the end point of the second auxiliary line 3*b*, the image line 3 is scanned with irradiating the laser beam, and the first auxiliary line 3*a* and the second auxiliary line 3*b* are scanned without irradiating the laser beam to thereby record the image. As a result, as shown in FIG. 3A right view, the scanning speed of the scanning mirror is not decelerated at the start point S3 and the end point E3, and it is possible to prevent an excessive amount of energy from being applied to the start point S3 and the end point E3 and to reduce deterioration of the thermally reversible recording medium when an image is repeatedly recorded and erased.

Thus, according to the method of recording a character "A" of the present invention as illustrated in FIG. 3A left view, the scanning speed of the scanning mirror is not decelerated at the start points S1, S2 and S3 and the end points of E1, E2 and E3 in each of the image lines 1, 2 and 3, and it is possible to prevent an excessive amount of energy from being applied to these points and to reduce deterioration of the thermally reversible recording medium when an image is repeatedly recorded and erased.

Figure 3B:
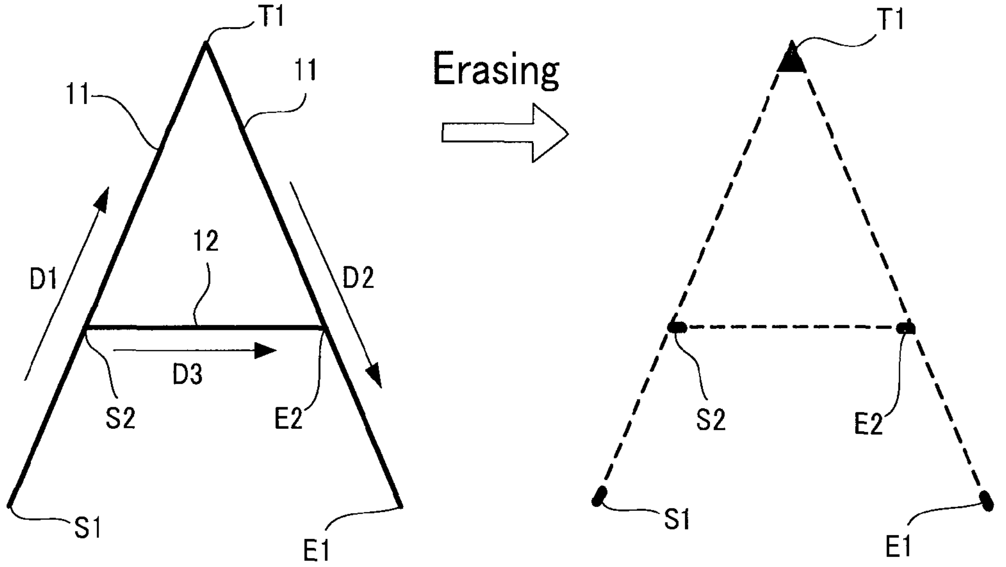
FIG. 3B left view is an illustration showing one example of a method of recording a character "A" according to an image recording step in a conventional image processing method.

In contrast to the above-mentioned recording method, FIG. 3B left view shows one example of a method of recording a character "A" according to an image recording step in a conventional image processing method. First, a thermally reversible recording medium is irradiated with a laser beam, and an image line 11 is recorded in a D1 direction. The image line 11 is recorded with being continuously recorded at a folding portion T1 in a D2 direction. Here, irradiation of the laser beam is stopped, the focal point of the laser beam irradiation is moved to a start point S2 of an image line 12, and the image line 12 is recorded in a D3 direction. Specifically, in the recording of a character "A" as illustrated in FIG. 3B left view, since the scanning direction of the laser beam is changed by changing a mirror angle by motor actuation, and thus the scanning speed of the laser beam at the folding portion T1 is decelerated. As a result, an excessive amount of energy is applied to the folding portion T1, as shown in FIG. 3B right view, resulting in damage to the thermally reversible recording medium due to repeated image recording and image erasing.

Further, at the start point S1, the end point E1 of the image line 11 and the start point S2 and the end point E2 of the image line 12, an irradiation direction of the laser beam is changed by changing a mirror angle by motor actuation, and the laser beam is irradiated to portions to be recorded to thereby record each of the image lines 11 and 12. For this reason, the scanning speed is decelerated due to acceleration and deceleration operations during a time period from a stopped state of the scanning mirror until the scanning mirror begins to be actuated or during a time period from an actuated state of the scanning mirror until the scanning mirror is stopped. Consequently, an excessive amount of energy is applied to the start points S1, S2 and the end points E1 and E2, as shown in FIG. 3B, resulting in damage to the thermally reversible recording medium due to repeated image recording and image erasing.

In the image processing method according to the first embodiment of the present invention, a light irradiation intensity $I_1$ at a center position of the laser beam irradiated in the image recording step and a light irradiation intensity $I_2$ on an 80% light energy bordering surface to the total light energy of the irradiated laser beam satisfy the expression, $0.40 \leqq I_1/I_2 \leqq 2.00$.

In the image recording step, the thermally reversible recording medium be irradiated with the laser beam so that in a light intensity distribution of the laser beam, a light irradiation intensity $I_1$ at a center position of the irradiated laser beam and a light irradiation intensity $I_2$ on an 80% light energy bordering surface to the total light energy of the irradiated laser beam satisfy the expression, $0.40 \leqq I_1/I_2 \leqq 2.00$.

Here, the center position of the irradiated laser beam is a position that can be determined by dividing a sum of a product of a light irradiation intensity at each position and a coordinate at the each position by a sum of light irradiation intensities at each of the positions and can be represented by the following expression.

$$\Sigma(r_i \times I_i)/\Sigma I_i$$

In the expression, "$r_i$" represents a coordinate at each position, "$I_i$" represents a light irradiation intensity at the each position, and "$\Sigma I_i$" represents a sum of light irradiation intensities.

The total irradiation energy means the entire energy of a laser beam irradiated onto the thermally reversible recording medium.

Conventionally, when a pattern is formed using a laser, a light intensity distribution on a cross-section in the perpendicular direction to the proceeding direction of a scanned laser beam (hereinafter, may be referred to as "the proceeding direction") is a Gauss distribution, and the light intensity at a center position of the irradiated laser beam is much higher than the light irradiation intensity at peripheral portions thereof. When the laser beam having a Gauss distribution is applied to the thermally reversible recording medium and an image is repeatedly formed and erased, a site of the recording medium corresponding to the center position of the irradiated laser beam deteriorates due to excessively increased temperature at the center position, and the number of repeatedly image recording and erasing times should be reduced. Further, when the laser irradiation energy is reduced so as not to increase the temperature at the center position to a temperature at which the thermally reversible recording medium could deteriorate, it may cause problems with a reduction in image size, a reduction in contrast, and taking much time in image formation.

Then, in the image processing method of the present invention, in a light intensity distribution on a cross-section in a substantially perpendicular direction to the proceeding direction of the laser beam irradiated in the image recording step, the light irradiation intensity at a center position in the light intensity distribution is controlled so as to be lower than the light irradiation intensity at peripheral portions thereof, in contrast to a Gauss distribution. With this configuration, the image processing method achieves an improvement in repetitive durability of a thermally reversible recording medium while preventing deterioration of the thermally reversible recording medium attributable to repeated recording and erasing, as well as maintaining an image contrast, but without reducing the image in size.

Here, when a light intensity distribution of the irradiated laser beam is separated so that a horizontal plane in a perpendicular direction to the proceeding direction occupies 20% of the total energy and includes a maximum value, and when a light intensity on the horizontal plane is represented by $I_2$ and a light intensity at the center position of the light intensity in the irradiated laser beam is represented by $I_1$, a light intensity ratio $I_1/I_2$ of a Gauss distribution (normal distribution) is 2.30.

The light intensity ratio $I_1/I_2$ is preferably set to 0.40 or more, more preferably set to 0.50 or more, still more preferably set to 0.60 or more, and particularly preferably set to 0.70 or more. Further, the light intensity ratio $I_1/I_2$ is preferably 2.00 or less, more preferably 1.90 or less, still more preferably 1.80 or less, and particularly preferably 1.70 or less.

In the present invention, the lower limit value of the ratio $I_1/I_2$ is preferably 0.40, more preferably 0.50, still more preferably 0.60, and particularly preferably 0.70. In the present invention, the upper limit of the ratio $I_1/I_2$ is preferably 2.00, more preferably 1.90, still more preferably 1.80, and particularly preferably 1.70.

When the ratio $I_1/I_2$ is more than 2.00, the light intensity at the center position of the irradiated laser beam is increased, an excessive amount of energy is applied to the thermally reversible recording medium, and when an image is repeatedly recorded and erased, erasure residue may occur due to deterioration of the thermally reversible recording medium. In the meanwhile, the ratio $I_1/I_2$ is less than 0.40, irradiation energy is less applied to the center position of the irradiated laser beam than to peripheral portions thereof, when an image is recorded, the center portion of a line may not be color-developed, and the line may be split into two lines. When the irradiation energy is increased so that the center portion of the line is color-developed, the light intensity at the peripheral portions is excessively increased, an excessive amount of energy is applied to the thermally reversible recording medium, and when an image is repeatedly recorded and erased, erasure residue may occur in peripheral portions of the line due to deterioration of the thermally reversible recording medium.

Further, when the ratio $I_1/I_2$ is greater than 1.59, the light irradiation intensity at the center position of the laser beam is higher than the light irradiation intensity at the peripheral portions, and thus, the thickness of image lines can be changed while preventing deterioration of the thermally reversible recording medium due to repeated image recording and image erasing, without necessity of changing the irradiation distance, by controlling the irradiation power.

Figure 1B:
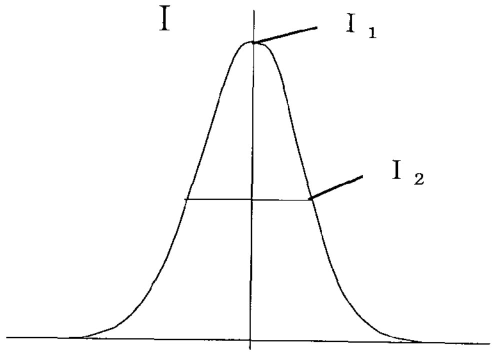
FIG. 1B is a schematic illustration showing a light intensity distribution (Gauss distribution) of a commonly used laser beam.
Figure 1C:
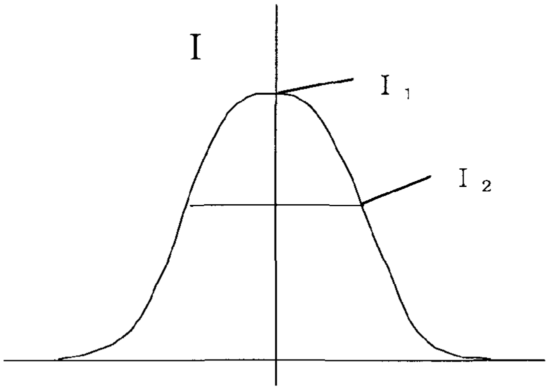
FIG. 1C is a schematic illustration showing one example of a light intensity distribution obtained when a light intensity of a laser beam is changed.
Figure 1D:
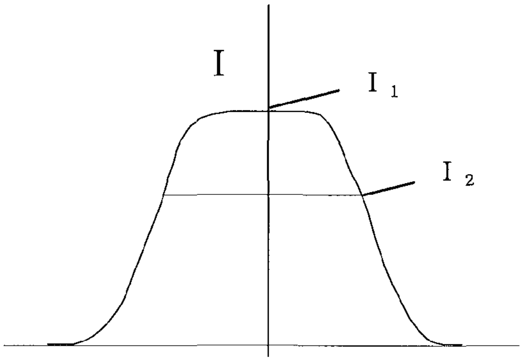
FIG. 1D is a schematic illustration showing another example of a light intensity distribution obtained when a light intensity of a laser beam is changed.
Figure 1E:
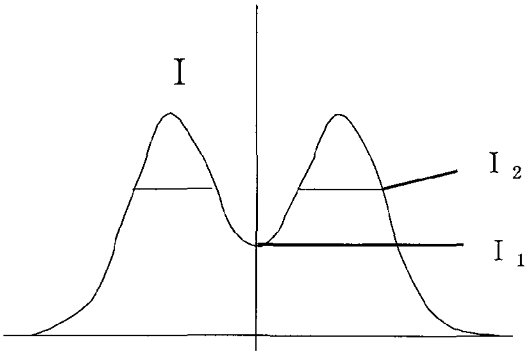
FIG. 1E is a schematic illustration showing still another example of a light intensity distribution obtained when a light intensity of a laser beam is changed.

FIGS. 1B to 1E respectively show one example of a light intensity distribution curve obtained when a light intensity of the irradiated laser beam is changed. FIG. 1B shows a Gauss distribution. In such a light intensity distribution having a highest light irradiation intensity at a center portion thereof, a ratio of $I_1/I_2$ becomes high (in a Gauss distribution, a ratio of $I_1/I_2=2.3$). Further, in a light intensity distribution, as shown in FIG. 1C, having a lower light irradiation intensity at a center position thereof than in the light intensity distribution as shown in FIG. 1B, a ratio of $I_1/I_2$ is lower than that in the light intensity distribution as shown in FIG. 1B. In a light intensity distribution having a top-hat shape as shown in FIG. 1D, a ratio of $I_1/I_2$ is lower than that in the light intensity distribution as shown in FIG. 1C. In a light intensity distribution, as shown in FIG. 1E, where the light irradiation intensity at a center position of the irradiated laser beam is low and the light intensity distribution in peripheral portions thereof is high, a ratio of $I_1/I_2$ is lower than that in the light intensity distribution as shown in FIG. 1D. Accordingly, the ratio of $I_1/I_2$ represents a shape of the light intensity distribution of the laser beam.

When the ratio of $I_1/I_2$ is 1.59 or less, a top-hat shaped light intensity distribution or a light intensity distribution where the light intensity at a center portion thereof is lower than the light intensity at peripheral portions thereof appears.

Here, the "80% light energy bordering surface of the total light energy of the irradiated laser beam" means a surface or a plane marked, for example, as shown in FIG. 1A, it means a surface or a plane marked when a light intensity of an irradiated laser beam is measured using a high-power beam analyzer using a high-sensitive pyroelectric camera, the obtained light intensity is three-dimensionally graphed, and the light intensity distribution is separated so that 80% of the total light energy sandwiched by a horizontal plane to a plane where Z is equal to zero and the plane where Z is equal to zero is contained therebetween.

In the image processing method according to the first embodiment to the third embodiment of the present invention, a laser emitting the laser beam is not particularly limited and may be suitably selected from among those known in the art. Examples thereof include $CO_2$ lasers, YAG lasers, fiber lasers, and laser diodes (LDs).

For a measurement method of the light intensity on a cross-section in the perpendicular direction to the proceeding direction of the laser beam, when the laser beam is emitted from, for example, a laser diode, a YAG laser or the like and has a wavelength within the near-infrared range, the light intensity can be measured using a laser beam profiler using a CCD etc. When the laser beam is emitted from a $CO_2$ laser and has a wavelength in the far-infrared range, the CCD cannot be used. Thus, the light intensity can be measured using a combination of a beam splitter and a power meter, a high-power beam analyzer using a high-sensitive pyroelectric camera, or the like.

A method of changing the light intensity distribution of the laser beam of the Gauss distribution such that a light irradiation intensity $I_1$ at a center portion of the irradiated laser beam and a light irradiation intensity $I_2$ on an 80% light energy bordering surface to the total light energy of the irradiated laser beam satisfy the expression, $0.40 \leqq I_1/I_2 \leqq 2.00$ is not particularly limited and may be suitably selected in accordance with the intended use. For example, a light irradiation intensity controlling unit can be preferably used.

Preferred examples of the light irradiation intensity controlling unit include lenses, filters, masks, mirrors, and fiber-coupling devices, however, the light irradiation intensity controlling unit is not limited thereto. Of these, lenses are preferable because they have less energy loss. For the lens, a collide scope, an integrator, a beam-homogenizer, an aspheric beam-shaper (a combination of an intensity conversion lens and a phase correction lens), an aspheric device lens, a diffractive optical element or the like can be preferably used. In particular, aspheric device lenses and diffractive optical elements are preferable.

When a filter or a mask is used, the light irradiation intensity can be controlled by physically cutting a center portion of the laser beam. When a mirror is used, the light irradiation intensity can be controlled by using a deformable mirror which is capable of mechanically changing the shape of a light beam in conjunction with a computer or a mirror whose reflectance or surface convexoconcaves can be partially changed.

In the case of a laser having an oscillation wavelength of near-infrared light or visible light, it is preferable to use it because the light irradiation intensity can be easily controlled by fiber-coupling.

The method of controlling a light irradiation intensity using the light irradiation intensity controlling unit will be described below in the description of the image processor of the present invention.

In the first embodiment of the present invention, a laser emitting the laser beam is not particularly limited and may be suitably selected from among conventional lasers. For example, $CO_2$ lasers, YAG lasers, fiber lasers, laser diodes (LDs) are exemplified.

Since the wavelength of a laser beam emitted from the $CO_2$ laser is 10.6 μm within the far-infrared region and the thermally reversible recording medium absorbs the laser beam, there is no need to add additives used for absorbing the laser beam and generating heat to record and erase an image on the thermally reversible recording medium. Further, the additives sometimes absorb a visible light in a small amount even when a laser beam having a wavelength within the near-infrared range is used. Thus, the $CO_2$ laser that needs no addition of the additives has an advantage in that it can prevent reduction in image contrast.

A wavelength of a laser beam emitted from the YAG laser, the fiber laser or the LD ranges from the visible range to the near-infrared range (several hundreds micrometers to 1.2 μm). Because an existing thermally reversible recording medium does not absorb laser beam within the wavelength range, it is necessary to add a photothermal conversion material for absorbing a laser beam and converting it into heat. However, these lasers respectively have an advantage in that a highly fine image can be recorded because of the short wavelength thereof.

Further, because the YAG laser and the fiber laser are high-power lasers, they have an advantage in that the recording speed and the erasing speed when recording an image can be speeded up. Since the LD is small in size, it is advantageous in that it enables down-sizing of the equipment and low-production cost.

In the image processing method according to the second embodiment of the present invention, recording at start points and end points of the image lines is performed in a state where the scanning speed of a laser beam does not attain a substantially uniform motion.

Figure 2:
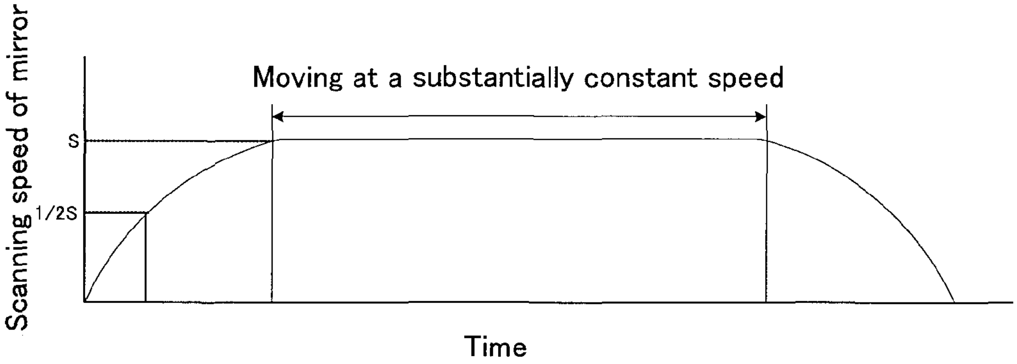
FIG. 2 is a graph showing a relation between a scanning speed of a mirror and time.

To record image lines at start points and end points of the image lines in a state where the scanning speed of a laser beam does not attain a substantially uniform motion is not particularly limited as long as the scanning speed of the laser beam does not attain a substantially uniform motion. Specifically, it is preferable to record image lines at a speed of ½ to ⅔ times the uniform motion speed. With this configuration, repetitive durability of the thermally reversible recording medium can be increased and the recording time can be shortened. As shown in FIG. 2, since at start points and end points of image lines, it takes some time from a stopped state of the scanning mirror to the time when the scanning mirror begins to be actuated and the scanning speed becomes a substantially uniform motion speed (S), it takes long time to print the image lines in a state where the scanning speed at the start points and the end points becomes a substantially uniform motion speed. The timing that the scanning mirror begins to move or the scanning speed of the scanning mirror immediately before stoppage thereof is substantially slow and an excessive amount of energy is applied particularly to these portions of the thermally reversible recording medium. Even when recording is started by irradiating a thermally reversible recording medium with a laser beam in a state where the scanning speed of a laser beam does not attain a substantially uniform motion (for example, a speed of ½S), an excessive amount of energy is not applied to starts point and end points of image lines, and thus repetitive durability of the thermally reversible recording medium does not degrade. Therefore, recording time can be shortened. Note that the state where the scanning speed of the laser beam does not attain a substantially uniform motion may be a state where the scanning speed of the laser beam is faster than a uniform motion speed.

In also the second embodiment of the present invention, a laser emitting the laser beam is not particularly limited and may be suitably selected from among conventional lasers. Examples of the laser include $CO_2$ lasers, YAG lasers, fiber lasers, and laser diodes (LDs).

In the image processing method according to the third embodiment of the present invention, a laser emitting the laser beam is a $CO_2$ laser.

For the laser emitting the laser beam, $CO_2$ lasers, YAG lasers, fiber lasers, and laser diodes (LDs) are exemplified, however, in the third embodiment of the present invention, a $CO_2$ laser is used. A laser having a wavelength of 700 nm to 1,500 nm (YAG laser, LD etc.) needs a material that absorbs light having such a wavelength (photothermal conversion material), and only a layer containing a photothermal conversion material is heated. In contrast to this, because a $CO_2$ laser which has a wavelength of 10,600 nm is absorbed in polymers (resins) and is also absorbed in not only a recording layer and a protective layer but also in a substrate used therein, the whole of the thermally reversible recording medium is heated. Thus, the use of a $CO_2$ laser is advantageous in that heat accumulation effect is large and energy of the laser beam can be efficiently utilized.

In the image processing method according to the fourth embodiment of the present invention, in a light intensity distribution on a cross-section in a substantially perpendicular direction to the proceeding direction of a laser beam irradiated in at least any one of the image recording step and the image erasing step, a light irradiation intensity at a center portion is equal to or lower than a light irradiation intensity at peripheral portions thereof; in the image recording step, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

In a light intensity distribution on a cross-section in a substantially perpendicular direction to the proceeding direction of a laser beam (hereinafter, may be referred to as "perpendicular cross-section to the laser beam proceeding direction") irradiated in at least any one of the image recording step and the image erasing step, the thermally reversible recording medium is irradiated with the laser beam so that a light irradiation intensity at a center portion is equal to or lower than a light irradiation intensity at peripheral portions thereof.

Conventionally, when a pattern is formed using a laser, a light intensity distribution on perpendicular cross-section to the laser beam proceeding direction is a Gauss distribution, and a light intensity at a center position of the irradiated laser beam is much higher than a light irradiation intensity at peripheral portions thereof. When the laser beam having a Gauss distribution is applied to the thermally reversible recording medium and an image is repeatedly formed and erased, a site of the recording medium corresponding to the center portion of the irradiated laser beam deteriorates due to excessively increased temperature at the center portion, and the number of repeatedly image recording and erasing times should be reduced. Further, when the laser irradiation energy is reduced so as not to increase the temperature at the center position to a temperature at which the thermally reversible recording medium could deteriorate, it may cause problems with a reduction in image size, a reduction in contrast, and taking much time in image formation.

Then, in the image processing method of the present invention, in a light intensity distribution on a cross-section in a substantially perpendicular direction to the proceeding direction of the laser beam irradiated in the image recording step, the light irradiation intensity at a center position in the light intensity distribution is controlled so as to be lower than the light irradiation intensity at peripheral portions thereof. With this configuration, the image processing method achieves an improvement in repetitive durability of a thermally reversible recording medium while preventing deterioration of the thermally reversible recording medium attributable to repeated recording and erasing, as well as maintaining an image contrast, but without necessity of reducing the image in size.

[Center Portion and Peripheral Portions in Light Intensity Distribution]

The "center portion" in a light intensity distribution on a cross-section in a substantially perpendicular direction to the proceeding direction of the laser beam means a region corresponding to an area sandwiched by peak top portions of two maximum peaks, which are downwardly projected in a differential curve where a curve representing the light intensity distribution is differentiated twice. The "peripheral portions" means regions corresponding to areas other than the "center portion".

As for "a light irradiation intensity at a center portion", when a light intensity distribution of the center portion is represented by a curve, it represents a peak top portion of the curve, and when the light intensity distribution curve has a convex shape which is upwardly projected, it represents a light irradiation intensity at the peak top, and when the light intensity distribution curve has a concave shape which is downwardly projected, it represents a light irradiation intensity at the peak bottom. Further, when the light intensity distribution curve has a shape in which there are both a convex portion and a concave portion, the light irradiation intensity at a center portion represents a light irradiation intensity of a peak top portion positioned at a region near to the center within the center portion.

Further, when the light irradiation distribution in the center portion is represented by a straight line, the light irradiation intensity at a center portion means a light irradiation intensity in the highest portion of the straight line, however, in this case, it is preferable that the light irradiation intensity at the center portion be constant (a light intensity distribution in the center portion be represented by a horizontal line).

In the meanwhile, as for "a light irradiation intensity at peripheral portions", when the light intensity distribution at peripheral portions is represented by any one of a curve and a straight line, it represents a light irradiation intensity at the highest portion in any one of the curve and the straight line.

Hereinafter, light irradiation intensities at "a center portion" and "peripheral portions" in a light intensity distribution on a perpendicular cross-section to the proceeding direction of the laser beam are exemplarily shown in FIGS. 10A to 10E. Note that, in FIGS. 10A to 10E, in the order of highest illustration to lowest illustration, there are respectively shown a curve representing a light intensity distribution, a differential curve (X') in which the curve representing the light intensity curve is differentiated once, and a differential curve (X") in which the curve representing the light intensity curve is differentiated twice.

FIGS. 10A, 10B, 10C, and 10D respectively shows a light intensity distribution of a laser beam used in the image processing method of the present invention, and the light irradiation intensity at the center portion is equal to or lower than the light irradiation intensity at the peripheral portions.

Figure 10A:
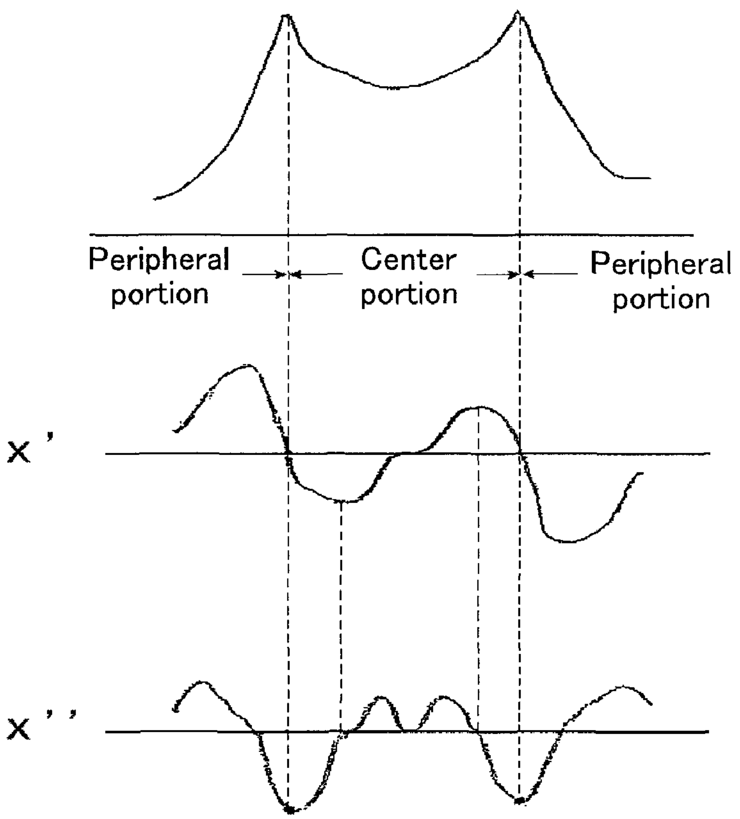
FIG. 10A is a schematic illustration showing one example of light irradiation intensities at "a center portion" and "peripheral portions" in a light intensity distribution on a cross-section in the perpendicular direction to the proceeding direction of a laser beam used in the image processing method of the present invention.
Figure 10B:
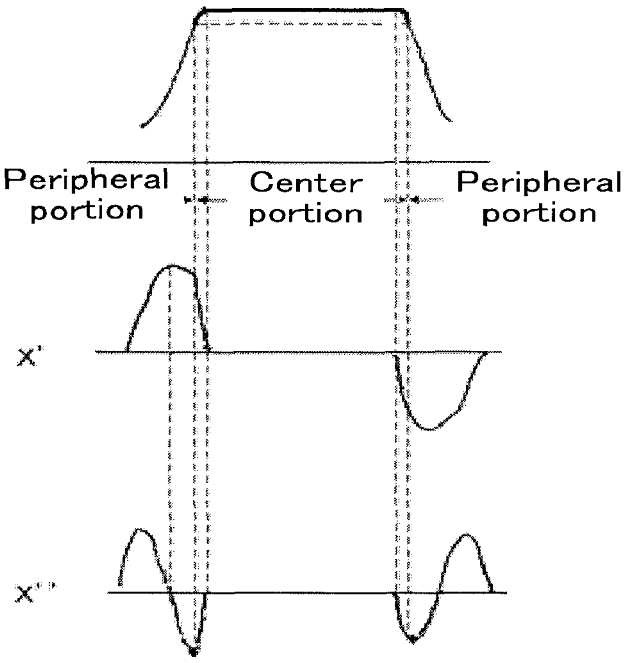
FIG. 10B is a schematic illustration showing another example of light irradiation intensities at "a center portion" and "peripheral portions" in a light intensity distribution on a cross-section in the perpendicular direction to the proceeding direction of a laser beam used in the image processing method of the present invention.
Figure 10C:
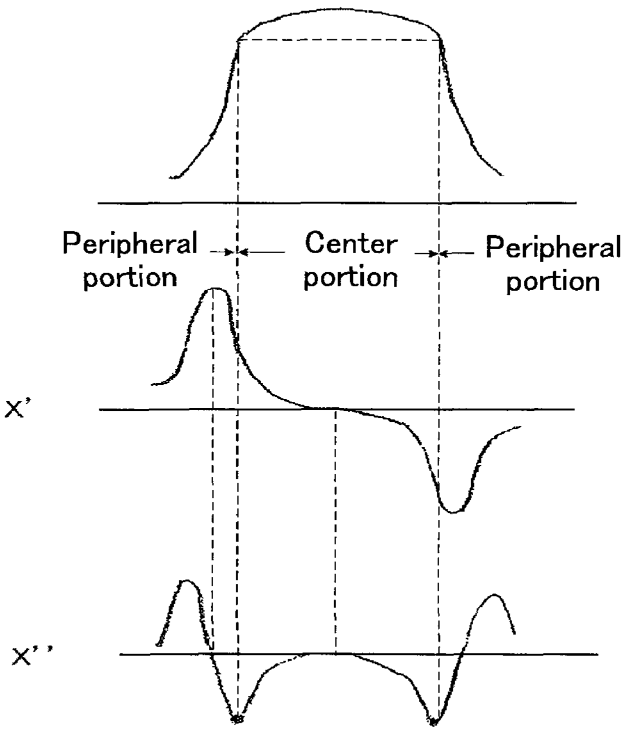
FIG. 10C is a schematic illustration showing still another example of light irradiation intensities at "a center portion" and "peripheral portions" in a light intensity distribution on a cross-section in the perpendicular direction to the proceeding direction of a laser beam used in the image processing method of the present invention.
Figure 10D:
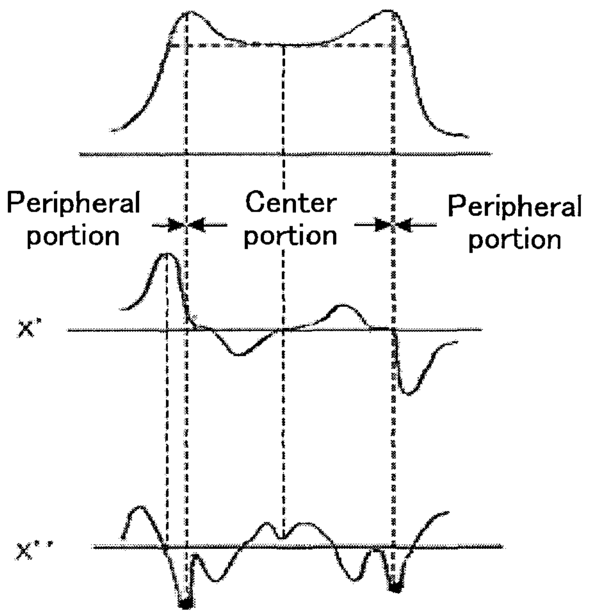
FIG. 10D is a schematic illustration showing yet still another example of light irradiation intensities at "a center portion" and "peripheral portions" in a light intensity distribution on a cross-section in the perpendicular direction to the proceeding direction of a laser beam used in the image processing method of the present invention.
Figure 10E:
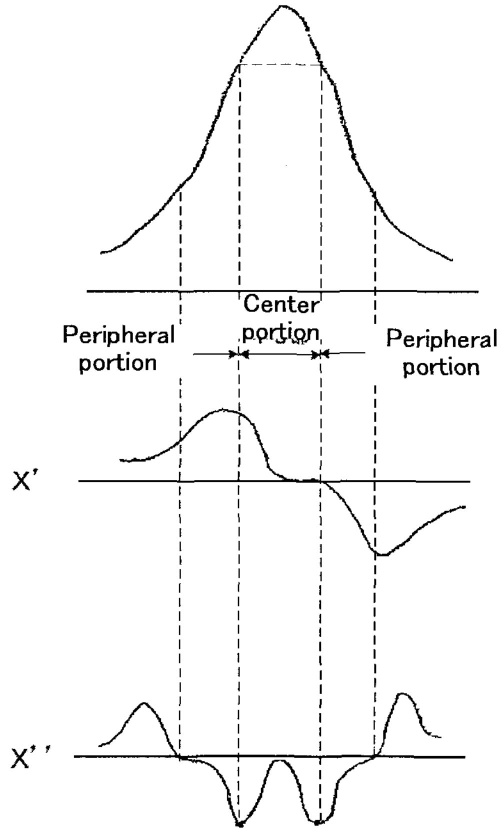
FIG. 10E is a schematic illustration showing light irradiation intensities at "a center portion" and "peripheral portions" in a light intensity distribution (Gauss distribution) on a cross-section in the perpendicular direction to the proceeding direction of a commonly used laser beam.

In the meanwhile, FIG. 10E shows a light intensity distribution of a commonly used laser beam, the light intensity distribution has a shape of a Gauss distribution, in which the light irradiation intensity at the center portion is extremely higher than the light irradiation intensity at peripheral portions thereof.

In the light intensity distribution on a perpendicular cross-section to the proceeding direction of the laser beam, for a relation between a light irradiation intensity at the center portion and a light irradiation intensity at the peripheral portions, the light irradiation intensity at the center portion needs to be equal to or lower than the light irradiation intensity at the peripheral portions. The term "be equal to or lower than the light irradiation intensity at the peripheral portions" means that the light irradiation intensity at the center portion is 1.05 times or less, preferably 1.03 times or less, more preferably 1.0 times or less, and the light irradiation intensity at the center portion is lower than that of the peripheral portions, i.e., it is particularly preferable that the light irradiation intensity at the center portion be less than 1.0 times the light irradiation intensity at the peripheral portions.

When the light irradiation intensity at the center portion is 1.05 times the light irradiation intensity at the peripheral portions, it is possible to prevent deterioration of the thermally reversible recording medium due to an increase in temperature at the center portion.

In the meanwhile, the lower limit value of the light irradiation intensity at the center portion is not particularly limited and may be suitably selected in accordance with the intended use, however, it is preferably 0.1 times or more and more preferably 0.3 times or more to the light irradiation intensity at the peripheral portions.

When the light irradiation intensity at the center portion is less than 0.1 times the light irradiation intensity at the peripheral portions, the temperature of the thermally reversible recording medium at an irradiation spot of the laser beam is not sufficiently increased, and the image density at the center portion may become lower than the image density at the peripheral portions, and images may not be erased on a sufficient level.

As a method of measuring a light intensity distribution on a perpendicular cross-section to the proceeding direction of the laser beam, when the laser beam is emitted from, for example, a laser diode, a YAG laser or the like and has a wavelength of a near-infrared region, it can be measured by using a laser beam profiler using a CCD. Further, when the laser beam is emitted from a $CO_2$ laser and has a wavelength of far-infrared region, the CCD cannot be used, and thus it can be measured by using a combination of a beam-splitter and a power meter, a high-powered beam analyzer using a highly-sensitive pyroelectric camera.

A method of changing a light intensity distribution on a perpendicular cross-section to the proceeding direction of the laser beam from the Gauss distribution to a light intensity distribution where a light irradiation intensity at the center portion is equal to or lower than a light irradiation intensity at peripheral portions thereof is not particularly limited and may be suitably selected in accordance with the intended use, however, a light irradiation intensity controlling unit can be preferably used.

Preferred examples of the light irradiation intensity controlling unit include lenses, filters, masks, and mirrors. Specifically, a collide scope, an integrator, a beam-homogenizer, an aspheric beam-shaper (a combination of an intensity conversion lens and a phase correction lens) or the like can be preferably used. When a filter or a mask is used, the light irradiation intensity can be controlled by physically cutting a center part of the laser beam. When a mirror is used, the light irradiation intensity can be controlled by using a deformable mirror which is capable of mechanically changing the shape of a light beam in conjunction with a computer or a mirror whose reflectance or surface convexoconcaves can be partially changed.

It is also possible to control the light irradiation intensity by shifting a distance between the light irradiation intensity controlling unit and the lens from the focal distance. Further, when a laser diode, a YAG laser and the like are fiber-coupled, the light irradiation intensity can be easily controlled.

The method of controlling a light irradiation intensity using the light irradiation intensity controlling unit will be described below in the description of the image processor of the present invention.

In the fourth embodiment of the present invention, a laser emitting the laser beam is not particularly limited and may be suitably selected from among those known in the art. Examples thereof include $CO_2$ lasers, YAG lasers, fiber lasers, and laser diodes (LDs).

Since the wavelength of a laser beam emitted from the $CO_2$ laser is 10.6 μm of far-infrared region, and the thermally reversible recording medium absorbs the laser beam, there is not need to add additives to absorb the laser beam and generate heat for the purpose of recording and erasing images on the thermally reversible recording medium. Further, the additives may absorb a visible light in a small amount even when a laser beam having a wavelength of near-infrared region is used, and thus the use of the $CO_2$ laser eliminating the use of the additives is advantageous in that it can prevent a reduction in image contrast.

A wavelength of a laser beam emitted from the YAG laser, the fiber laser or the LD ranges from the visible range to the near-infrared range (several hundreds micrometers to 1.2 μm). Because an existing thermally reversible recording medium does not absorb laser beam within the wavelength range, it is necessary to add a photothermal conversion material for absorbing a laser beam and converting it into heat. However, these lasers respectively have an advantage in that a highly fine image can be recorded because of the short wavelength thereof.

Further, because the YAG laser and the fiber laser are high-power lasers, they have an advantage in that image recording and image erasing can be speeded up. Since the LD is small in size, it is advantageous in that it enables down-sizing of the equipment and low-production cost.

In the first embodiment to the fourth embodiment of the present invention, it is preferable to control irradiation conditions of a laser beam irradiated to a thermally reversible recording medium in accordance with at least any of a temperature of the thermally reversible recording medium and the peripheral temperature.

For example, when a temperature of the thermally reversible recording medium is low, it is preferable to tighten conditions for irradiating a laser beam to the thermally reversible recording medium, and in contrast, when the temperature is high, it is preferable to loosen the conditions for irradiating a laser beam to the thermally reversible recording medium in terms that it enables uniform image recording and uniform image erasing.

For example, when an image is repeatedly recorded and erased, heat accumulation effect works, the thermally reversible recording medium is excessively heated, the thermally reversible recording medium deteriorates particularly at start points, end points and folding portions of image lines to which an excessive energy is applied, and an image recording defect and an image erasing defect may occur due to deterioration of the thermally reversible recording medium. In particular, when an image is repeatedly recorded and erased using a $CO_2$ laser, heat accumulation effect is large, and thus deterioration of the thermally reversible recording medium may proceed.

Specifically, for example, when a temperature of the thermally reversible recording medium is detected as a high temperature because of heat accumulation, it is preferable to reduce irradiation power of a laser beam irradiated to the thermally reversible recording medium, to increase the scanning speed, to reduce the number of pulses of the laser beam, to increase the spot diameter of the laser beam or to elongate the time used to scan first auxiliary lines and second auxiliary lines. For a detecting unit of a temperature of the thermally reversible recording medium, infrared cameras and radiation thermometers are exemplified.

Here, the peripheral temperature means an environmental temperature in which the thermally reversible recording medium is used or when the thermally reversible recording medium is affixed to a plastic box, for example, the peripheral temperature means a temperature inside the plastic box.

The output power of a laser beam irradiated in the image recording step is not particularly limited and may be suitably selected in accordance with the intended use, however, it is preferably 1 W or more, more preferably 3 W or more, and still more preferably 5 W or more. The output power of the laser beam is less than 1 W, it takes some time to record an image, and when the image recording time is intended to shorten, a high-density image cannot be obtained due to an insufficient output power. The upper limit of the output power of the laser beam is not particularly limited and may be suitably selected in accordance with the intended use, however, it is preferably 200 W or less, more preferably 150 W or less, and still more preferably 100 W or less. When the output power of the laser beam is more than 200 W, the laser device used is possibly increased in size.

The scanning speed of a laser beam irradiated in the image recording step is not particularly limited and may be suitably selected in accordance with the intended use, however, it is preferably 300 mm/s or more, more preferably 500 mm/s or more, and still more preferably 700 mm/s or more. When the scanning speed is less than 300 mm/s or less, it takes some time to record an image. The upper limit of the scanning speed of the laser beam is not particularly limited and may be suitably selected in accordance with the intended use, however, it is preferably 15,000 mm/s or less, more preferably 10,000 mm/s or less, and still more preferably 8,000 mm/s or less. When the scanning speed is more than 15,000 mm/s, there may be a difficulty in recording a uniform image.

The spot diameter of a laser beam irradiated in the image recording step is not particularly limited and may be suitably selected in accordance with the intended use, however, it is preferably 0.02 mm or more, more preferably 0.1 mm or more, and still more preferably 0.15 mm/s or more. The upper limit of the spot diameter of the laser beam is not particularly limited and may be suitably selected in accordance with the intended use, however, it is preferably 3.0 mm or less, more preferably 2.5 mm or less, and still more preferably 2.0 mm or less. When the spot diameter is small, the line width of lines constituting an image becomes thin, the contrast becomes low, resulting in a low visibility. When the spot diameter is large, the line width of lines constituting an image becomes thick, adjacent lines are overlapped with each other, resulting in incapability of printing small characters.

The output power of a laser beam irradiated in the image erasing step where a recorded image is erased by irradiating and heating the thermally reversing recording medium with the laser beam is not particularly limited and may be suitably selected in accordance with the intended use, however, it is preferably 5 W or more, more preferably 7 W or more, and still more preferably 10 W or more. When the output power of the laser beam is less than 5 W, it takes some time to erase a recorded image, and when the image erasing time is intended to shorten, an image erasing defect occurs due to an insufficient output power. The upper limit of the output power of the laser beam is not particularly limited and may be suitably selected in accordance with the intended use, however, it is preferably 200 W or less, more preferably 150 W or less, and still more preferably 100 W or less. When the output power of the laser beam is more than 200 W, the laser device used is possibly increased in size.

The scanning speed of a laser beam irradiated in the image erasing step where a recorded image is erased by irradiating and heating the thermally reversible recording medium with the laser beam is not particularly limited and may be suitably selected in accordance with the intended use, however, it is preferably 100 mm/s or more, more preferably 200 mm/s or more, and still more preferably 300 mm/s or more. When the scanning speed is less than 100 mm/s, it takes some time to erase a recorded image. The upper limit of the scanning speed of the laser beam is not particularly limited and may be suitably selected in accordance with the intended use, however, it is preferably 20,000 mm/s or less, more preferably 15,000 mm/s or less, and still more preferably 10,000 mm/s or less. When the scanning speed is more than 20,000 mm/s, there may be a difficulty in recording a uniform image.

The spot diameter of a laser beam irradiated in the image erasing step where a recorded image is erased by irradiating and heating the thermally reversible recording medium with the laser beam is not particularly limited and may be suitably selected in accordance with the intended use, however, it is preferably 0.5 mm or more, more preferably 1.0 mm or more, and still more preferably 2.0 mm or more. The upper limit of the spot diameter of the laser beam is not particularly limited and may be suitably selected in accordance with the intended use, however, it is preferably 14.0 mm or less, more preferably 10.0 mm or less, and still more preferably 7.0 mm or less. When the spot diameter is small, it takes some time to erase a recorded image. When the spot diameter is large, an image erasing defect may occur due to an insufficient output power.

<Mechanism of Image Recording and Image Erasing>

Mechanism of the image recording and image erasing is based on an aspect that transparency reversibly changes depending on temperature, and an aspect that the color tone reversibly changes depending on temperature.

In the aspect that transparency reversibly changes, the organic low-molecules contained in the thermally reversible recording medium are dispersed in particulate form in the resin, and the transparency reversibly changes between a transparent state and a white turbidity state by effect of heat.

The visibility of change in the transparency is derived from the following phenomena. Specifically, (1) in the case of a transparent state, since particles of the organic low-molecular material dispersed in a resin base material adhere tightly to the resin base material and no void exists inside the particles, light entering from one side transmits to the opposite side, and it appears to be transparent. In the meanwhile, (2) in the case of a white-turbid state, particles of the organic low-molecular material are formed with a fine crystal of the organic low-molecular material, voids (spaces) are generated at the interface of the crystal or at the interface between the particles and the resin base particles, and light emitting from one side is refracted and scattered on the interface between the void and the crystal or at the interface between the void and the resin. For this reason, it appears to be white.

Figure 4A:
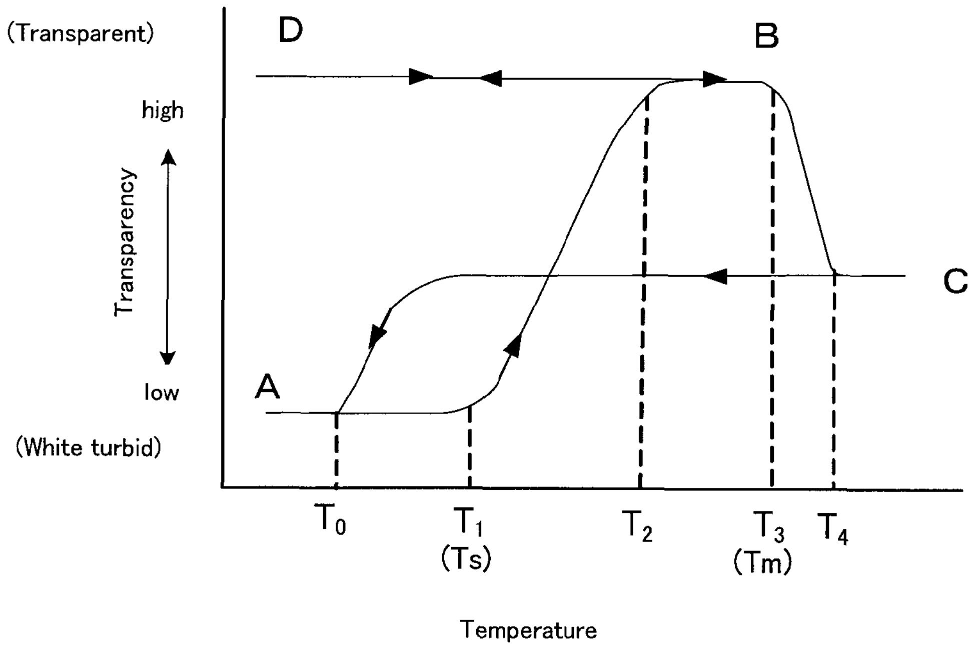
FIG. 4A is a graph showing transparency-white turbidity property of a thermally reversible recording medium of the present invention.

FIG. 4A shows one example of the temperature-transparency change curve of a thermally reversible recording medium having a thermosensitive recording layer (hereinafter, may be referred to as "recording layer") in which the organic low-molecular material is dispersed in the resin.

The recording layer is in a white-turbid and opaque state (A) at a normal temperature of $T_0$ or less. When the recording layer is heated, it gradually becomes transparent from a temperature $T_1$. When the recording layer is heated at a temperature $T_2$ to $T_3$, it becomes transparent (B). Even though the temperature is restored to the normal temperature $T_0$ or less from this state, the recording layer remains transparent (D). This can be considered as follows. The resin starts to be softened at near the temperature $T_1$, and the resin shrinks as the softening progresses to reduce the voids at the interface between the resin and the organic low-molecular material particles or inside the particles, therefore, the transparency is gradually increased. At the temperature $T_2$ to $T_3$, the organic low-molecular material becomes semi-molten, or remaining voids are filled with the organic low-molecular material and then the recording layer becomes transparent. When the recording layer is cooled in a state where a seed crystal remains thereon, it is crystallized at a relatively high-temperature. Since the resin is still in a softened state at this point in time, the resin can follow a change in volume of the particles associated with the crystallization, and the transparent state can be maintained without generating the voids.

When the recording layer is further heated to a temperature $T_4$ or more, it becomes a semi-transparent state (C) which is an intermediate state between the maximum transparency and the maximum opacity. Next, when the temperature is lowered, the state of the recording layer returns to the initial state of white-turbid and opaque state (A) without becoming a transparent state. This can be considered as follows. After the organic low-molecular material is completely dissolved at the temperature $T_4$ or more, the organic low-molecular material becomes supercooled, and crystallized at a temperature slightly higher than the temperature $T_0$. In the crystallization, the resin cannot follow a change in volume of the particles associated with the crystallization, and thus voids are generated.

However, in the temperature-transparency variation curve shown in FIG. 4A, when the type of the resin, the organic low-molecular material and the like is changed, the transparency in the respective states may vary depending on the type.

Figure 4B:
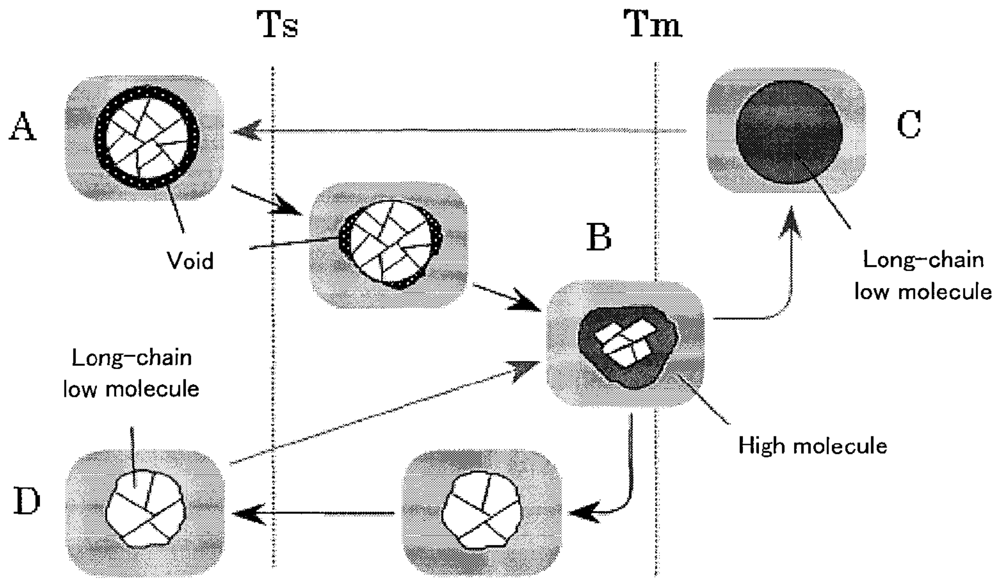
FIG. 4B is a schematic illustration showing a mechanism of a change between transparency and white turbidity of a thermally reversible recording medium of the present invention.

Further, FIG. 4B is a schematic illustration showing a mechanism of a change in transparency of a thermally reversible recording medium that reversibly changes between a transparent state and a white-turbid state by effect of heat.

In FIG. 4B, one long-chain low-molecule particle and high-molecule particles around the long-chain low-molecule particle are taken, and generation of voids and a change in color-erasure associated with heating and cooling are illustrated. In the white-turbid state (A), voids are generated between a high-molecular particle and a low-molecule particle (or inside particles), and the recording layer is in a light-scattered state. Then, the recording layer is heated to a temperature higher than the softening point (Ts) of the high-molecule, the number of voids decreases and the transparency increases. When the recording layer is further heated to near the melting point (Tm) of the low-molecule particle, part of the low-molecule particle is melted, and the voids are filled with the low-molecule particle because of volume expansion of the melted low-molecule particle, the voids disappear, and the recording layer is in the transparent state (B). When the recording layer is cooled from that state, the low-molecule particle is crystallized at the melting point (Tm) thereof, and the transparent state (D) is maintained even at room temperature, without generating voids.

Next, when the recording layer is heated to a temperature higher than the melting point of the low-molecule particle, a difference in refractive index arises between the melted low-molecule particle and the circumjacent high-molecules, and the recording layer becomes semi-transparent (semi-transparent state) (C). When the recording layer is cooled to the room temperature, the low-molecule particle shows a super-cooling phenomenon, is crystallized at a temperature lower than the softening point of the high-molecule. Since the high-molecule is in a glass state at this point in time, the circumjacent high-molecules cannot follow a reduction in volume of the particles associated with the crystallization of the low-molecule particle, voids are generated, and the recording layer returns to its original state of the white-turbid state (A).

For the above-mentioned reasons, even when the organic low-molecular material is heated to an image-erasing temperature before being crystallized, the organic low-molecular material is in a molten state, and thus it becomes supercooled. Because the resin cannot follow a change in volume of the particles associated with the crystallization of the organic low-molecular material, voids are generated, and thus it is considered that the recording layer becomes white-turbid.

Next, in the aspect that color tone reversibly changes depending on temperature, the unmelted organic low-molecular material is composed of a leuco dye and a reversible developer (hereinafter, may be referred to as "developer") that have been dissolved therein; and the uncrystallized organic low-molecular material is composed of the leuco dye and the developer, and the color tone reversibly changes between a transparent state and a color-developed state by effect of heat.

Figure 5A:
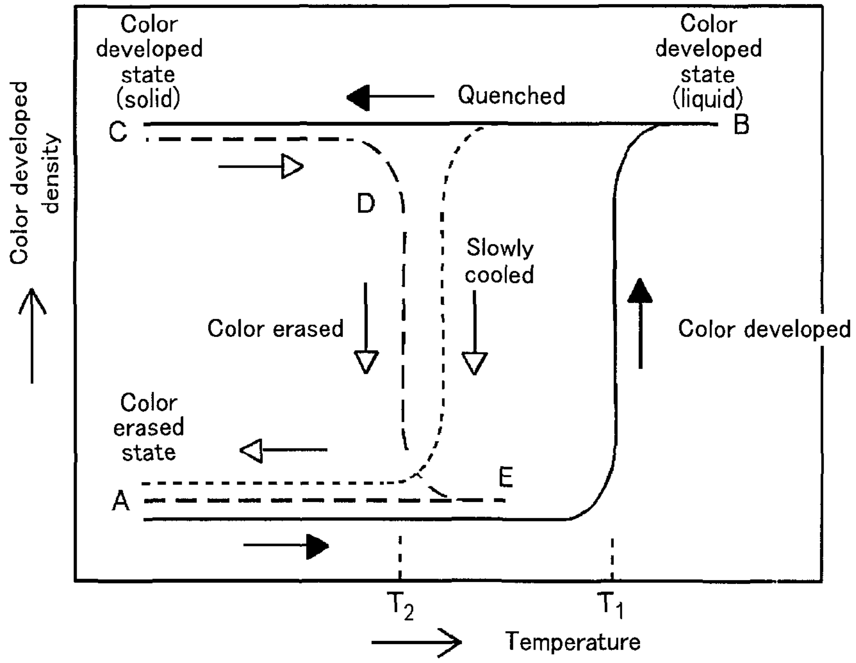
FIG. 5A is a graph showing color developing-color erasing property of a thermally reversible recording medium of the present invention.
Figure 5B:
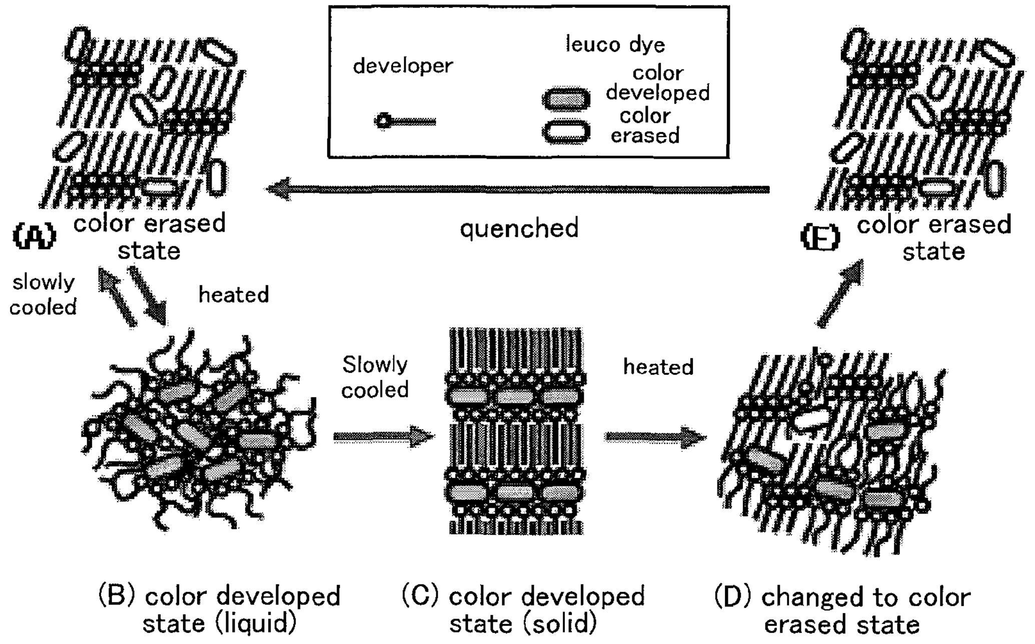
FIG. 5B is a schematic illustration showing a mechanism of a change between color developing and color erasing of a thermally reversible recording medium of the present invention.

FIG. 5A shows one example of the temperature-color development density variation curve of a thermally reversible recording medium having a reversible thermosensitive recording layer containing the leuco dye and the developer in the resin. FIG. 5B shows a color developing-color erasing mechanism of a thermally reversible recording medium in which a transparent state and a color-developed state is reversible changed by effect of heat.

First, when the recording layer being originally in a color-erased state is heated, the leuco dye and the developer are melted and mixed at a melting temperature $T_1$, the recording layer is color-developed to become a melt-color-developed state (B). From the melt-color-developed state, the recording layer is quenched, the recording layer can be decreased in temperature in a state where the color-developed state remains. The color-developed state is stabilized and solidified to become a color developed-state (C). Whether or not the color-developed state can be obtained depends on the decreasing temperature rate when measured from the molten state. When the recording layer is slowly cooled, the color is erased in the course of temperature decrease to be in a color-erased state (A) same as the original state or in a state where the density is relatively lower than that in the color-developed-state (C) caused by quenching. In the meanwhile, the recording layer is again increased in temperature from the color-developed state (C), the color is erased (from D to E) at a temperature $T_2$ lower than the color development temperature, and when the recording layer is decreased in temperature from this state, it returns to the color-erased state (A) that is the same as the original state.

The color-developed state (C) obtained by quenching the recording layer from a molten state is in a state where the leuco dye and the developer are mixed in a state where molecules thereof can contact react with each other, in which, it is likely to form a solid state. This state is a state where the melt mixture of the leuco dye and the developer (the color development mixture) is crystallized to keep the color development, and it can be considered that the color development is stabilized by the form of the structure. In the meanwhile, the color erased state is a state where the leuco dye and the developer phase-separate from each other. This state is a state where molecules of at least one compound aggregate to form a domain or to be crystallized, and can be considered as a stabilized state where the leuco dye and the developer phase-separate from each other by aggregation or crystallization of the molecules. In many cases, more complete color-erased state is ensured by a phase separation between the leuco dye and the developer and a crystallization of the developer.

Note that in both color-erasure by quenching the recording layer from a molten state and color-erasure by increasing the temperature of the recording layer from a color-developed state shown in FIG. 5A, the aggregation structure is changed at the temperature $T_2$ to cause a phase change between the leuco dye and the developer and the crystallization of the developer.

In view of the above-mentioned, it is considered that when the recording layer is heated to an image erasing temperature before the color development mixture formed of the developer melted in the leuco dye is crystallized, and a phase separation between the leuco dye and the developer is prevented; as a result, the color-developed state is maintained.

[Thermally Reversible Recording Medium]

The thermally reversible recording medium used in the image processing method of the present invention has at least a substrate and a reversible thermosensitive recording layer and further has other layers suitably selected in accordance with necessity such as a protective layer, an intermediate layer, an undercoat layer, a back layer, a photothermal conversion layer, an adhesive layer, a tacky layer, a colored layer, an air-space layer and a light reflective layer. Each of these layers may be formed in a single-layer structure or a multi-layered structure.

-Substrate-

The substrate is not particularly limited as to the shape, structure, size, and the like, and may be suitably selected in accordance with the intended use. For the shape, for example, a planar shape is exemplified. The structure may be a single structure or a multi-layered structure. The size of the substrate can be suitably selected in accordance with the size of the thermally reversible recording medium.

Examples of material of the substrate include inorganic materials and organic materials.

Examples of the inorganic materials include glass, quartz, silicons, silicone oxides, aluminum oxides, $SiO_2$, and metals.

Examples of the organic materials include paper; cellulose derivatives such as triacetate cellulose; synthetic paper; and films of polyethylene terephthalate, polycarbonate, polystyrene, and polymethyl methacrylate.

Each of these inorganic materials and organic materials may be used alone or in combination with two or more. Of these, organic materials are preferable. Films of polyethylene terephthalate, polycarbonate, polymethyl methacrylate or the like are preferable. Polyethylene terephthalate is particularly preferable.

It is preferable that the substrate surface be reformed by subjecting to a corona discharge treatment, an oxidation treatment (chromic acid, etc.), an etching treatment, an easy adhesion treatment, or an antistatic treatment for the purpose of improving the adhesion property of the coating layer.

Further, the substrate surface can be colored in white by adding a white pigment such as titanium oxide.

The thickness of the substrate is not particularly limited and may be suitably selected in accordance with the intended use, however, it is preferably 10 μm to 2,000 μm and more preferably 50 μm to 1,000 μm.

-Reversible Thermosensitive Recording Layer-

The reversible thermosensitive recording layer (hereinafter, may be referred to as "recording layer" simply) contains at least a material that reversibly changes any one of its transparency and color tone depending on temperature and further contains other components in accordance with the intended use.

The material that reversibly changes any one of its transparency and color tone depending on temperature is a material capable of expressing a phenomenon of reversibly generating a visible change by a change in temperature and is capable of changing between a relatively color-developed state and a color-erased state depending on a difference in heating temperature and cooling rate after heating. In this case, the visible change is classified into a change in color state and a change in shape. The change in color state is attributable to a change, for example, in transmittance, reflectance, absorption wavelength and scattering level, and the thermally reversible recording medium virtually changes in color tone state depending on a combination of these changes.

The material that reversibly changes any one of its transparency and color tone depending on temperature is not particularly limited and may be suitably selected from among those known in the art, however, a material that reversibly changes any one of its transparency and color tone at between the first specific temperature and the second specific temperature is particularly preferable in terms that it allows for easily controlling the temperature and obtaining a high-contrast.

Specific examples thereof include a material that becomes transparent at a first specific temperature and becomes white-turbid at a second specific temperature (see Japanese Patent Application Laid-Open (JP-A) No. 55-154198), a material that is color-developed at a second specific temperature and is color-erased at a first specific temperature (see Japanese Patent Application Laid-Open (JP-A) Nos. 4-224996, 4-247985, 4-267190, etc.), a material that becomes white-turbid at a first specific temperature and becomes transparent at a second specific temperature (see Japanese Patent Application Laid-Open (JP-A) No. 3-169590), and a material that is color-developed in black, red, blue or the like at a first specific temperature and is color-erased at a second specific temperature (see Japanese Patent Application Laid-Open (JP-A) Nos. 2-188293, 2-188294, etc.)

Of these, a thermally reversible recording medium containing a resin base material and an organic low-molecular material such as a higher-fatty acid which is dispersed in the resin base material is advantageous in that a second specific temperature and a first specific temperature are relatively low and images can be recorded and erased with low-energy. Further, the color-developing and color-erasing mechanism of such a material is based on a physical change depending on solidification of the resin and crystallization of the organic low-molecular material, and thus the material has strong environmental resistance.

Further, a thermally reversible recording medium using a leuco dye and a reversible developer, which will be described hereinafter, is color-developed at a second specific temperature and is color-erased at a first specific temperature, reversibly changes between a transparent state and a color-developed state, and it allows for obtaining a high-contrast image because the thermally reversible recording medium can be colored in black, blue or other colors in the color-developed state.

The organic low-molecular material (which is dispersed in a resin base material, is in a transparent state at a first specific temperature and is in a white-turbid state at a second specific temperature) used in the thermally reversible recording medium is not particularly limited as long as it can change from a polycrystal to a single crystal by effect of heat, and may be suitably selected in accordance with the intended use.

Typically, an organic material having a melting point of around 30° C. to 200° C. can be used, and an organic material having a melting point of 50° C. to 150° C. is preferably used.

Such an organic low-molecular material is not particularly limited and may be suitably selected in accordance with the intended use. Examples thereof include alkanol; alkane diol; halogen alkanol or halogen alkane diol; alkyl amine; alkane; alkene; alkyne; halogen alkane; halogen alkene; halogen alkyne; cycloalkane; cycloalkene; cycycloalkyne; unsaturated or saturated mono carboxylic acid or unsaturated or saturated dicarboxylic acid and esters thereof, and amide or ammonium salts thereof; unsaturated or saturated halogen fatty acids and esters thereof, and amide or ammonium salts thereof; aryl carboxylic acids and esters thereof, and amide or ammonium salts thereof; halogen allyl carboxylic acids and esters thereof, and amide or ammonium salts thereof; thioalcohols; thiocarboxylic acids and esters thereof, and amine or ammonium salts thereof; and carboxylic acid esters of thioalcohol. Each of these organic low-molecular materials may be used alone or in combination with two or more.

The number of carbon atoms of these compounds is preferably 10 to 60, more preferably 10 to 38, and particularly preferably 10 to 30. Alcohol base sites in the esters may be saturated, unsaturated or halogen-substituted.

Further, the organic low-molecular material preferably contains at least one selected from oxygen, nitrogen, sulfur and halogen in molecules thereof, for example, —OH, —COOH, —CONH—, —COOR, —NH—, —$NH_2$, —S—, —S—S—, —O—, halogen atom, etc.

Specific examples of these compounds include higher fatty acids such as lauric acid, dodecanoic acid, myristic acid, pentadecanoic acid, palmitic acid, stearic acid, behenic acid, nonadecanoic acid, alginic acid, and oleic acid; and higher fatty acid esters such as methyl stearate, tetradecyl stearate, octadecyl stearate, octadecyl laurate, and tetradecyl palmitate. Of these, as an organic low-molecular material used in the third embodiment of the image processing method, a higher fatty acid is preferable, a higher fatty acid having 16 or more carbon atoms such as palmitic acid, stearic acid, behenic acid, and lignoceric acid, is more preferable, and a higher fatty acid having 16 to 24 carbon atoms is still more preferable.

To widen the range of temperature at which the thermally reversible recording medium can be made transparent, the above-mentioned various organic low-molecular materials may be used in combination with each other suitably, or a combination of the organic low-molecular material and another material having a different melting point from that of the organic low-molecular material may be used. These materials are disclosed, for example, in Japanese Patent Application Laid-Open (JP-A) Nos. 63-39378 and 63-130380 and Japanese Patent (JP-B) No. 2615200, however, are not limited thereto.

The resin base material serves to form a layer in which the organic low-molecular material is uniformly dispersed and maintained and affects the transparency of the thermally reversible recording layer at the time of obtaining the maximum transparency. Therefore, the resin base material is preferably a resin having high-transparency, mechanical stability and excellent layer-formability.

Such a resin is not particularly limited and may be suitably selected in accordance with the intended use. Examples thereof include polyvinyl chlorides; vinyl chloride copolymers such as vinyl chloride-vinyl acetate copolymer, vinyl chloride-vinyl acetate-vinyl alcohol copolymer, vinyl chloride-vinyl acetate-maleic acid copolymer, and vinyl chloride-acrylate copolymer; polyvinylidene chlorides; vinylidene chloride copolymers such as vinylidene chloride-vinyl chloride copolymers, and vinylidene chloride-acrylonitrile copolymer; polyesters; polyamides, polyacrylate or polymethacrylate or acrylate-methacrylate copolymers; and silicone resins. Each of these resins may be used alone or in combination with two or more.

A ratio of the organic low-molecular material to the resin (resin base material) in the recording layer, as expressed as a mass ratio, is preferably about 2:1 to 1:16 and more preferably 1:2 to 1:8.

When the ratio of the resin is smaller than 2:1, there may be cases where it is difficult to form a layer in which the organic low-molecular material is held in the resin base material. When the ratio of the resin is greater than 1:16, there may be cases where it is difficult to make the recording layer opacified.

Besides the organic low-molecular material and the resin, to facilitate recording of a transplant image, other components such as a high-boiling point solvent and a surfactant can be added to the recording layer.

A method of forming the recording layer is not particularly limited and may be suitably selected in accordance with the intended use. For example, a dispersion liquid in which the organic low-molecular material is dispersed in particulate form in a solution with two components of the resin base material and the organic low-molecular material dissolved therein or a solution of the resin base material (for the solvent, a solvent in which at least one selected from the organic low-molecular materials is insoluble is used) is applied over a surface of the substrate, and the substrate surface is dried to thereby a recording layer can be formed.

The solvent used for forming the recording layer is not particularly limited and may be suitably selected in accordance with the type of the resin base material and the organic low-molecular material. For example, tetrahydrofuran, methylethylketone, methylisobutylketone, chloroform, carbon tetrachloride, ethanol, toluene and benzene are exemplified.

In a recording layer formed by using the solution, not to mention a recording layer formed by using the dispersion liquid, the organic low-molecular material is deposited as a fine particle and exists in particulate form.

In the thermally reversible recording medium, the organic low-molecular material may be a material that is composed of the leuco dye and the reversible developer, develops color at a second specific temperature and erases color at a first specific temperature. The leuco dye is a colorless or pale color dye precursor itself. The leuco dye is not particularly limited and may be suitably selected from among those known in the art. Preferred examples thereof include leuco compounds such as triphenyl methane phthalide leuco compounds, triallyl methane leuco compounds, fluoran leuco compounds, phenothiazine leuco compounds, thiofluoran leuco compounds, xanthene leuco compounds, indophthalyl leuco compounds, spiropyran leuco compounds, azaphthalide leuco compounds, couromeno-pyrazole leuco compounds, methine leuco compounds, rhodamineanilinolactam leuco compounds, rhodaminelactam leuco compounds, quinazoline leuco compounds, diazaxanthene leuco compounds, and bislactone leuco compounds. Of these, fluoran leuco dyes and phthalide leuco dyes are particularly preferable in terms that they are excellent in color developing-color erasing property, hue, storage stability and the like. Each of these dyes may be sued alone or in combination with two or more. Further, by forming a layer that develops different color tones in a multilayered structure, it is possible to use the layer in multi-color image formation or in full-color image formation.

The reversible developer is not particularly limited as long as it can reversibly develop and erase color by utilizing heat as a factor, and may be suitably selected in accordance with the intended use. Preferred examples of the reversible developer include a compound having, in molecules thereof, one or more structures selected from (1) a structure having color developability for developing color of the leuco dye (for example, phenolic hydroxyl group, carboxylic group, phosphoric group, etc.) and (2) a structure of controlling cohesive attraction between molecules (for example, a structure in which a long-chain hydrocarbon group is bonded). In the bonded site, the long-chain hydrocarbon group may be bonded via a divalent or more bond group containing a hetero atom. Further, in the long-chain hydrocarbon group, at least any of the same bond group and an aromatic group may be contained.

For the (1) structure having color developability for developing color of leuco dye, phenol is preferable.

For the (2) structure of controlling cohesive attraction between molecules, a long-chain hydrocarbon group having 8 or more carbon atoms is preferable. The number of carbon atoms is more preferably 11 or more, and the upper limit of the number of carbon atoms is preferably 40 or less and more preferably 30 or less.

Among the reversible developers, a phenol compound represented by the following General Formula (1) is preferable, and a phenol compound represented by the following General Formula (2) is more preferable.

General Formula (1)

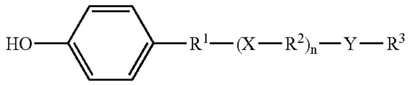

General Formula (2)

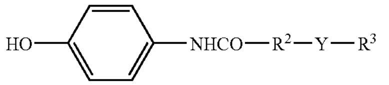

In General Formulas (1) and (2), "$R^1$" represents a single bond aliphatic hydrocarbon group or a fatty acid hydrocarbon group having 1 to 24 carbon atoms; "$R^2$" represents an aliphatic hydrocarbon group having 2 or more carbon atoms that may have a substituent group, the number of carbon atoms is preferably 5 or more and more preferably 10 or more; and "$R^3$" represents an aliphatic hydrocarbon group having 1 to 35 carbon atoms, and the number of carbon atoms is preferably 6 to 35 and more preferably 8 to 35. Each of these aliphatic hydrocarbon groups may exist singularly or two or more selected therefrom may be combined.

The sum of the number of carbon atoms in the $R^1$, $R^2$, and $R^3$ is not particularly limited and may be suitably selected in accordance with the intended use, however, the lower limit of the sum is preferably 8 or more and more preferably 11 or more. The upper limit of the sum is preferably 40 or less and more preferably 35 or less.

When the sum of the number of carbon atoms is less than 8, the stability of color development and color erasing ability may degrade.

The aliphatic hydrocarbon group may be a straight chain or branched chain or may have an unsaturated bond, however, it is preferably a straight chain. Examples of the substituent group bonded to the hydrocarbon group include hydroxyl group, halogen atom, and alkoxy group.

"X" and "Y" may be the same to each other or different from each other, respectively represent a divalent group containing an N atom or an O atom. Specific examples thereof include oxygen atom, amide group, urea group, diacylhydrazine group, diamide-oxalate group, and acyl-urea group. Of these, amide group and urea group are preferable.

Further, "n" is an integer of 0 to 1.

For the reversible developer, it is preferable to use a compound having at least one of —NHCO— group and —OCONH— group be used in combination in molecules thereof as a color-erasing accelerator. In this case, in the course of forming a color-erased state, an inter-molecular interaction is induced between the color-erasing accelerator and the reversible developer, and the color developing-color erasing property is improved.

A mixing ratio between the leuco dye and the reversible developer cannot be unequivocally defined because the appropriate range varies depending on a combination of compounds to be used, however, generally, as expressed as a mole ratio, the mixing ratio of the reversible developer to the leuco dye is preferably 0.1 to 20 to 1 mole of the leuco dye and more preferably 0.2 moles to 10 moles to 1 mole of the leuco dye.

When the mixing ratio of the reversible developer is less than 0.1, or 20 or more, the color-developed density in the color-developed state may be reduced.

When the color-erasing accelerator is added, the additive amount thereof is preferably 0.1 parts by mass to 300 parts by mass and more preferably 3 parts by mass to 100 parts by mass to 100 parts by mass of the reversible developer.

Note that the leuco dye and the reversible developer may also be capsulated in a micro capsule for use.

When the organic low-molecular material is composed of the leuco dye and the reversible developer, the thermally reversible thermosensitive recording layer contains, besides these components, a binder resin and a crosslinker and further contains other components in accordance with necessity.

The binder resin is not particularly limited as long as it can bind the recording layer on the substrate, and it is possible to mix at least one suitably selected from conventional resins for use.

For the binder resin, to improve the durability in repetitive use, a resin that is curable by heat, ultraviolet ray, electron beam or the like is preferable, and a thermosetting resin using an isocyanate compound as a crosslinker is particularly preferable.

Examples of the thermosetting resin include a resin having a group capable of reacting to a crosslinker such as hydroxy group and carboxyl group; and a resin copolymerized between a monomer having a hydroxyl group, a carboxyl group or the like and another monomer. Such a thermosetting resin is not particularly limited and may be suitably selected in accordance with the intended use. Examples thereof include phenoxy resins, polyvinyl butyral resins, cellulose acetate propionate resins, cellulose acetate butylate resins, acrylpolyol resins, polyester polyol resins, and polyurethane polyol resins. Each of these thermosetting resins may be used alone or in combination with two or more. Of these, acrylpolyol resins, polyester polyol resins, polyurethane polyol resins are particularly preferable.

A mixing ratio (mass ratio) of the binder resin to the leuco dye in the recording layer is preferably 0.1 to 10 to 1 of the leuco dye. When the mixing ratio of the binder resin is less than 0.1, the heat strength of the recording layer may be sometimes insufficient, and when more than 10, color-developed density may degrade.

The crosslinker is not particularly limited and may be suitably selected in accordance with the intended use.

Examples thereof include isocyanates, amino resins, phenol resins, amines, and epoxy compounds. Of these, isocyanates are preferable, and a polyisocyanate compound having a plurality of isocyanate groups is particularly preferable.

The additive amount of the crosslinker to the binder resin, at a ratio of the number of functional groups of the crosslinker to the number of active groups contained in the binder resin, is preferably 0.01 to 2. When the ratio of the functional group is less than 0.01, the heat strength may be sometimes insufficient, and when more than 2, it may adversely affect the color developing-color erasing property.

Further, as a crosslinking accelerator, a catalyst that is generally used in this type of reaction may be used.

Examples of the crosslinking accelerator include tertiary amines such as 1,4-diazabicyclo [2,2,2]octane; and metal compounds such as organic tin compounds.

The gel percent of the thermosetting resin when heat-crosslinked is preferably 30% or more, more preferably 50% or more, and still more preferably 70% or more. When the gel percent is less than 30%, the durability may degrade due to an insufficient crosslinked state.

As a method of distinguishing whether the binder resin is in a crosslinked state or in a non-crosslinked state, it can be distinguished by immersing the coated layer in a solvent having high solubility. A binder resin being in a non-crosslinked state will be eluted into the solvent and will not remain in the solute.

For other components to be added to the recording layer, various additives for improving and controlling coating property and color-erasing property are exemplified. Examples of these additives include surfactants, plasticizers, conductive agents, fillers, antioxidants, light stabilizers, color-development stabilizers, and color-erasing accelerators.

A method of preparing the recording layer is not particularly limited and may be suitably selected in accordance with the intended use. Preferred examples of the method include (1) a method of which a recording layer coating solution with the binder resin, the leuco dye and the reversible developer dissolved or dispersed in a solvent is applied over a surface of the substrate, the solvent is evaporated from the solution to form a sheet on the substrate, and the applied coating solution is subjected to a crosslinking reaction at the same time or after the formation of the sheet; (2) a method of which a recording layer coating solution with the leuco dye and the reversible developer are dispersed in a solvent that is prepared by dissolving only the binder resin therein is applied over a surface of the substrate, the solvent is evaporated from the solution to form a sheet on the substrate, and the applied coating solution is subjected to a crosslinking reaction at the same time or after the formation of the sheet; and a method of which the binder resin, the leuco dye and the reversible developer are heated and melted so as to be mixed without using a solvent, the melted mixture is formed in a sheet, the sheet is cooled and then the cooled sheet is subjected to a crosslinking reaction.

In these methods, it is also possible to form a sheet-shaped thermally reversible recording medium without using the substrate. The recording layer coating solution may be prepared by dispersing various materials in a solvent using a dispersing device. Each of the materials may be singularly dispersed in a solvent to then be mixed therein, or materials may be heated and dissolved, thereafter the dissolved solution may be quenched or slowly cooled to thereby be deposited.

A solvent to be used in the methods of preparing a recording layer (1) or (2) is not particularly limited and may be suitably selected in accordance with the intended use, however, it varies depending on the type of the leuco dye and the reversible developer and cannot be defined unequivocally. Examples thereof include tetrahydrofuran, methylethylketone, methylisobutylketone, chloroform, carbon tetrachloride, ethanol, toluene, and benzene.

Note that the reversible developer exists in the recording layer in a state of being dispersed in particulate form.

To the recording layer coating solution, for the purpose of expressing high-performance as a coating material, various pigments, antifoaming agent, dispersing agent, slipping agent, antiseptic agent, crosslinker, plasticizer and the like may be added.

The coating method of the recording layer is not particularly limited and may be suitably selected in accordance with the intended use. A substrate may be conveyed in a roll in a continuous manner or a substrate cut in a sheet form may be conveyed, and the recording layer coating solution may be applied over a surface of the substrate, for example, by a conventional coating method such as blade coating, wire-bar coating, spray-coating, air-knife coating, bead coating, curtain coating, gravure coating, kiss coating, reverse-roller coating, dip coating, and die coating.

The drying conditions of the recording layer coating solution are not particularly limited and may be suitably selected in accordance with the intended use. For example, the applied recording layer coating solution may be dried at a temperature ranging from room temperature to 140° C. for 10 seconds to 10 minutes.

The thickness of the recording layer is not particularly limited and may be suitably adjusted in accordance with the intended use. For example, it is preferably 1 μm to 20 μm and more preferably 3 μm to 15 μm.

When the thickness of the recording layer is less than 1 μm, image contrast may be lowered because the color development density is lowered, and when more than 20 μm, the heat distribution inside layers becomes wide and portions that cannot develop color arise because the temperature falls below the color developing temperature, and a desired color development density may not be obtained.

-Protective Layer-

The protective layer is preferably formed on the recording layer for the purpose of protecting the recording layer.

The protective layer is not particularly limited and may be suitably selected in accordance with the intended use. For example, the protective layer may be formed into a plurality of layers, however, it is preferably formed as the outermost surface of an exposed layer.

The protective layer contains at least a binder resin and further contains other components such as filler, lubricant and color pigments in accordance with necessity.

The binder resin used in the protective layer is not particularly limited and may be suitably selected in accordance with the intended use, however, ultraviolet (UV) curable resins, thermosetting resins, electron beam curable resins are preferably exemplified. Of these, ultraviolet (UV) curable resins and thermosetting resins are particularly preferable.

Since a UV curable resin enables forming an extremely hard film after curing thereof and preventing deformation of a recording medium caused by damage of the surface via physical contact and heat from a used laser, with use of a UV curable resin, it is possible to obtain a thermally reversible recording medium that is excellent in repetitive durability.

A thermosetting resin also enables forming an extremely hard film, similarly to the case of using UV curable resin, although it is less curable than UV curable resin. Thus, with use of a thermosetting resin for the protective layer, a thermally reversible recording medium that is excellent in repetitive durability can be obtained.

The UV curable resin is not particularly limited and may be suitably selected from among those known in the art in accordance with the intended use. Examples thereof include urethane acrylate oligomers, epoxy acrylate oligomers, polyester acrylate oligomers, polyether acrylate oligomers, vinyl oligomers, and unsaturated polyester oligomers; various monofunctional or polyfunctional acrylates, methacrylates, vinyl esters, ethylene derivatives, and monomers of allyl compounds. Of these, tetrafunctional or more polyfunctional monomers or oligomers are particularly preferable. By mixing two or more selected from these monomers and oligomers, the hardness of a resin layer, shrinkage, flexibility, strength of the coated layer can be suitably controlled.

To cure the monomer or the oligomer using an ultraviolet ray, it is preferable to use a photopolymerization initiator and a photopolymerization accelerator.

The additive amount of the photopolymerization initiator and the photopolymerization accelerator is not particularly limited and may be suitably selected in accordance with the intended use, however, it is preferably 0.1% by mass to 20% by mass and more preferably 1% by mass to 10% by mass to the total mass of resin components used in the protective layer.

The ultraviolet curable resin can be irradiated to harden itself with an ultraviolet ray using a conventional ultraviolet irradiation device. For example, an ultraviolet irradiation device equipped with a light source, lamp fitting, a power source, a cooling apparatus, a conveyer is exemplified.

Examples of the light source include mercury lamps, metal halide lamps, potassium lamps, mercury xenon lamps, and flash lamps.

The wavelength of light emitted from the light source is not particularly limited and may be suitably selected in accordance with the ultraviolet ray absorptive wavelength of the photopolymerization initiator and the photopolymerization accelerator contained in the recording layer.

Irradiation conditions of the ultraviolet ray are not particularly limited and may be suitably selected in accordance with the intended use. The lamp output power, conveying speed and the like may be suitably determined in accordance with the irradiation energy required to cross-link the resin.

In order to ensure excellent conveyability, it is possible to add a releasing agent such as silicone having a polymerizable group, silicone-grafted polymer, wax, and zinc stearate; and a lubricant such as silicone oil.

The additive amount of the releasing agent and the lubricant is preferably 0.01% by mass to 50% by mass and more preferably 0.1% by mass to 40% by mass.

Even when the lubricant and the releasing agent are added in a slight amount, the effect can be exerted, however, when the additive amount is less than 0.01% by mass, there may be cases where an effect obtained by the addition may be hardly exerted, and when more than 50% by mass, it may cause a problem with adhesion property between the protective layer and a layer formed under the protective layer.

Further, an organic ultraviolet absorbent may be contained in the protective layer. The content of the organic ultraviolet absorbent is preferably 0.5% by mass to 10% by mass to the total mass of resin components in the protective layer.

To further improve the conveyability, an inorganic filler, an organic filler and the like may be added to the protective layer. Examples of the inorganic filler include calcium carbonate, kaolin, silica, aluminum hydroxide, alumina, aluminum silicate, magnesium hydroxide, titanium oxide, zinc oxide, barium sulfate, and talc. Each of these inorganic fillers may be used alone or in combination with two or more.

Further, a conductive filler is preferably used as a measure against static electricity. For the conductive filler, it is more preferable to use a conductive filler of a needle shape.

For the conductive filler, a titanium oxide whose surface is coated with antimony-doped tin oxide is particularly preferably exemplified.

The particle diameter of the inorganic filler is preferably 0.01 μm to 10.0 μm and more preferably 0.05 μm to 8.0 μm.

The additive amount of the inorganic filler is preferably 0.001 parts by mass to 2 parts by mass and more preferably 0.005 parts by mass to 1 part by mass to 1 part by mass of the binder resin contained in the protective layer.

The organic filler is not particularly limited and may be suitably selected in accordance with the intended use. Examples thereof include silicone resins, cellulose resins, epoxy resins, nylon resins, phenol resins, polyurethane resins, urea resins, melamine resins, polyester resins, polycarbonate resins, styrene resins, acryl resins, polyethylene resins, formaldehyde resins, and polymethyl methacrylate resins.

The thermosetting resin is preferably cross-linked. Thus, for the thermosetting resin, a thermosetting resin having a group capable of reacting to a curing agent, for example, hydroxy group, amino group, and carboxyl group, is preferable. A polymer having a hydroxyl group is particularly preferable.

The improve the strength of the protective layer, the hydroxyl group value of the thermosetting resin is preferably 10 mgKOH/g or more, more preferably 30 mgKOH/g or more, and still more preferably 40 mgKOH/g or more in terms that a sufficient coat layer strength can be obtained. By giving a sufficient coat layer strength to the protective layer, deterioration of the thermally reversible recording medium can be prevented even when an image is repeatedly erased and recorded. For the curing agent, for example, the same curing agent used in the recording layer can be suitably used.

To the protective layer, conventionally known surfactants, leveling agents, antistatic agents and the like may be added.

Further, a polymer having an ultraviolet absorbing structure (hereinafter, may be referred to as "ultraviolet absorptive polymer") may also be used.

Here, the polymer having an ultraviolet absorbing structure means a polymer having an ultraviolet absorbing structure (for example, ultraviolet absorptive group) in molecules thereof.

Examples of the ultraviolet absorbing structure include salicylate structure, cyanoacrylate structure, benzotriazole structure, and benzophenone structure. Of these, benzotriazole structure and benzophenone structure are particularly preferable in terms of its excellence in light resistance.

The polymer having an ultraviolet absorbing structure is not particularly limited and may be suitably selected in accordance with the intended use. Examples thereof include copolymers composed of 2-(2'-hydroxy-5'-methacryloxyethylphenyl)-2H-benzotriazole, 2-hydroxyethyl methacrylate and styrene, copolymers composed of 2-(2'-hydroxy-5'-methylphenyl)benzotriazole, 2-hydroxypropyl methacrylate and methyl methacrylate, copolymers composed of 2-(2'-hydroxy-3'-t-butyl-5'-methylphenyl)-5-chlorobenzotriazole, 2-hydroxyethyl methacrylate, methyl methacrylate and t-butyl methacrylate, and copolymers composed of 2,2,4,4-tetrahydroxybenzophenone, 2-hydroxypropyl methacrylate, styrene, methyl methacrylate and propyl methacrylate. Each of these polymers may be used alone or in combination with two or more.

For a solvent used for a coating solution of the protective layer, a dispersion device for coating solution, a coating method of the protective layer, and a drying method, those known methods explained in preparation of the recording layer can be used. When the ultraviolet curable resin is used, after applying the coating solution and drying the applied coating solution, it is necessary to cure the dried surface by ultraviolet irradiation. The ultraviolet ray irradiation device, light source, irradiation conditions and the like are as described hereinabove.

The thickness of the protective layer is not particularly limited and may be suitably selected in accordance with the intended use, however, it is preferably 0.1 μm to 20 μm, more preferably 0.5 μm to 10 μm, and still more preferably 1.5 μm to 6 μm. When the thickness of the protective layer is less than 0.1 μm, a function as a protective layer of the thermally reversible recording medium cannot be sufficiently exerted, the thermally reversible recording medium deteriorates soon due to repeated heat history and may not be repeatedly used. When the thickness is more than 20 μm, a sufficient amount of heat cannot be transmitted to the recording layer that is formed under the protective layer, and an image may not be sufficiently thermally recorded and erased.

-Intermediate Layer-

The intermediate layer is preferably formed in between the recording layer and the protective layer for the purpose of improving adhesion property therebetween, preventing transformation of the recording layer caused by forming the protective layer, and preventing migration of additives contained in the protective layer toward the recording layer. In this case, storage stability of color-developed images can be enhanced.

The protective layer contains at least a binder resin and further contains other components such as filler, lubricant and color pigments in accordance with necessity.

The binder resin to be used in the intermediate layer is not particularly limited and may be suitably selected in accordance with the intended use, and resin components such as the binder resins, thermoplastic resins, and thermosetting resins can be used.

Examples of the binder resin include polyethylene resins, polypropylene resins, polystyrene resins, polyvinyl alcohol resins, polyvinyl butyral resins, polyurethane resins, saturated polyester resins, unsaturated polyester resins, epoxy resins, phenol resins, polycarbonate resins and polyamide resins.

Further, it is preferable that an ultraviolet absorbent be contained in the intermediate layer. The ultraviolet absorbent is not particularly limited and may be suitably selected in accordance with the intended use. For example, both organic compounds and inorganic compounds can be used.

Note that the organic and inorganic ultraviolet absorbents may be contained in the recording layer.

Further, an ultraviolet absorbing polymer may also be used in the intermediate layer, and the ultraviolet absorbing polymer may be cured using a crosslinker. For the ultraviolet absorbing polymer and the crosslinker, the same ones as used for the protective layer can be preferably used.

The thickness of the intermediate layer is not particularly limited and may be suitably adjusted in accordance with the intended use, however, it is preferably 0.1 μm to 20 μm and more preferably 0.5 μm to 5 μm.

For a solvent used in a coating solution for the intermediate layer, a dispersing device for the coating solution, a coating method of the intermediate layer, a drying method and curing method of the intermediate layer, conventionally known methods that are described in the preparation of the recording layer can be used.

-Under Layer-

To efficiently utilize applied heat and make the recording medium have a high-sensitivity, or for the purpose of improving adhesion property between the substrate and the recording layer and preventing infiltration of the recording layer materials into the substrate, an under layer may be formed in between the recording layer and the substrate.

The under layer contains at least a hollow particle and further contains other components in accordance with necessity.

Examples of the hollow particle include a single hollow particle in which one void is present in one particle, and a multi-hollow particle in which a number of voids are present in one particle. Each of these hollow particles may be used alone or in combination with two or more.

Material of the hollow particle is not particularly limited and may be suitably selected in accordance with the intended use. For example, thermoplastic resins are preferably exemplified.

The hollow particle may be suitably produced or may be a commercially available product.

The additive amount of the hollow particle in the under layer is not particularly limited and may be suitably selected in accordance with the intended use, however, it is preferably 10% by mass to 80% by mass.

For the binder resin to be used in the under layer, the same resins used in the recording layer or the layer containing a polymer having an ultraviolet absorbing structure can be used.

Further, to the under layer, it is possible to add at least one selected from inorganic fillers such as calcium carbonate, magnesium carbonate, titanium oxide, silicon oxide, aluminum hydroxide, kaolin, and talc; and various fillers.

To the under layer, other components such as lubricant, surfactant, and dispersing agent can be added.

The thickness of the under layer is not particularly limited and may be suitably adjusted in accordance with the intended use, however, it is preferably 0.1 μm to 50 μm, more preferably 2 μm to 30 μm, and still more preferably 12 μm to 24 μm.

-Back Layer-

To prevent static charge build up and curling of the thermally reversible recording medium and to improve conveyability thereof, a back layer may be formed on the opposite surface from a substrate surface on which the recording layer is formed.

The back layer contains at least a binder resin and further contains other components such as filler, conductive filler, lubricant, and color pigments in accordance with necessity.

The binder resin to be used for the back layer is not particularly limited and may be suitably selected in accordance with the intended use. Examples thereof include thermosetting resins, ultraviolet (UV) curable resins, and electron beam curable resins. Of these, ultraviolet (UV) curable resins and thermosetting resins are particularly limited.

For the ultraviolet curable resin and the thermosetting resin to be used in the back layer, those used in the recording layer, the protective layer and the intermediate layer can be preferably used. The same applies to the filler, the conductive filler, and the lubricant.

-Photothermal Conversion Layer-

The photothermal conversion layer is a layer having a function to absorb laser beams and generate heat and contains at least a photothermal conversion material having a function to absorb laser beams and generate heat.

The photothermal material is broadly classified into inorganic materials and organic materials.

Examples of the inorganic materials include carbon black, metals such as Ge, Bi, In, Te, Se, and Cr, or semi-metals thereof or alloys thereof. Each of these inorganic materials is formed into a layer form by vacuum evaporation method or by bonding a particulate material to a layer surface using a resin or the like.

For the organic material, various dyes can be suitably used in accordance with the wavelength of light to be absorbed, however, when a laser diode is used as a light source, a near-infrared absorption pigment having an absorption peak near wavelengths of 700 nm to 1,500 nm. Specific examples of such a near-infrared absorption pigment include cyanine pigments, quinoline pigments, quinoline derivatives of indonaphthol, phenylene diamine-based nickel complexes, phthalocyanine pigments, and naphthalocyanine pigments. To repeatedly record and erase an image, it is preferable to select a photothermal material that is excellent in heat resistance.

Each of the near-infrared absorption pigments may be used alone or in combination with two or more. The near-infrared absorption pigment may be mixed in the recording layer. In this case, the recording layer also serves as the photothermal conversion layer.

When the photothermal conversion layer is formed, the photothermal conversion material is typically used in combination with a resin. The resin used in the photothermal conversion layer is not particularly limited and may be suitably selected from among those known in the art, as long as it can maintain the inorganic material and the organic material therein, however, thermoplastic resins and thermosetting resins are preferable.

-Adhesive Layer and Tacky Layer-

The thermally reversible recording medium can be obtained in a form of a thermally reversible recording label by forming an adhesive layer or a tacky layer on the opposite surface of the substrate from the surface with the recording layer formed thereon.

Materials used for the adhesive layer and the tacky layer are not particularly limited and may be suitably selected from generally used materials in accordance with the intended use.

The materials of the adhesive layer and the tacky layer may be hot melt type materials. Further, peel-off paper or non-peel-off type paper may be used. By forming the adhesive layer or the tacky layer as described above, the recording layer can be affixed on the entire surface or part of a surface of a thick substrate such as a vinyl chloride card provided with magnetic stripe over which the recording layer is hardly coated. With this treatment, convenience of the thermally reversible recording medium can be boosted, for example, part of information stored in a magnetism can be displayed.

Such a thermally reversible recording label with an adhesive layer or a tacky layer formed of a surface thereof is suitably used as a thick card such as IC card and optical card.

-Colored Layer-

In the thermally reversible recording medium, a colored layer may be formed in between the substrate and the recording layer for the purpose of improving visibility.

The colored layer can be formed by applying a solution or a dispersion liquid containing a colorant and a resin binder over an intended surface and dying the applied solution or dispersion liquid, or by affixing a color sheet to an intended surface, simply.

Instead of the colored layer, a color print layer may be formed. Examples of a colorant used in the color print layer include various dyes and pigments contained in color inks used in conventional full-color prints.

Examples of the resin binder include various resins such as thermoplastic resins, thermosetting resins, ultraviolet curable resins or electron beam curable resins.

The thickness of the color print layer is not particularly limited and may be suitably selected in accordance with a desired print color density, because the thickness is suitably changed in accordance with an intended print color density.

In the thermally reversible recording medium, a non-reversible recording layer may be used in combination with the reversible recording layer. In this case, the color development tones of the respective recording layers may be same to each other or different from each other.

Further, a colored layer with a picture or design arbitrarily formed on a surface thereof by printing method such as offset printing and gravure printing or an inkjet printer, a thermal transfer printer, a sublimation printer or the like may be formed on part of the same surface as the recording layer of the thermally reversible recording medium, or the entire surface thereof or part of the opposite surface therefrom. Further, on part of the colored layer or the entire surface thereof, an OP varnish layer containing primarily a curable resin may be formed.

For the picture of design, for example, characters, patterns, drawing designs, photographs, and information detected with use of an infrared ray.

Further, dyes and pigments can also be simply added to any of individual layers constituting the colored layer to color the layers.

Further, a hologram may be formed on the thermally reversible recording medium for security purpose. Furthermore, for giving designing property to the thermally reversible recording medium, a design such as portrait, corporate symbol and symbol mark can also be formed by forming convexoconcaves or irregularities in relief form.

-Shape and Use Application of Thermally Reversible Recording Medium-

The thermally reversible recording medium can be processed in a desired shape in accordance with use application. For example, it can be processed in a card shape, a tag shape, a label shape, a roll shape etc.

A thermally reversible recording medium formed in a card shape can be utilized for prepaid card, point card, credit card, and the like.

A thermally reversible recording medium formed in a tag shape which is smaller in size than card size can be utilized for price tag, and a thermally reversible recording medium formed in a tag shape which is larger in size than card size can be used for process management, shipping instructions, tickets and the like.

Since a thermally reversible recording medium formed in a label can be affixed to other substances, it can be formed in various sizes and used in process management, article management and the like by affixing it to wagons, containers, boxes, containers and the like, which will be repeatedly used. Further, a thermally reversible recording medium formed in a sheet which is larger in size than card size can be used for general documents, process management instructions and the like because of its wide area to be recorded.

-Combination Example of Thermally Reversible Recording Component and RF-ID-

In the thermally reversible recording component, the reversible thermosensitive recording layer (recording layer) that can reversibly display information and an information storage device are formed in one same card or tag (are integrated into one unit), and part of stored information in the information storage device can be displayed on the recording layer. Therefore, the thermally reversible recording component is extremely convenient and allows for checking information by taking a look at a card or a tag without necessity of preparing a special device. When the contents in the information storage device are rewritten, the thermally reversible recording medium can be repeatedly used by rewriting display data of the thermally reversible recording region.

The information storage device is not particularly limited and may be suitably selected in accordance with the intended use. Preferred examples thereof include magnetic recording layer, magnetic stripe, IC memory, optical memory and RF-ID tag. When the information storage device is used in process management, article management or the like, RF-ID tag can be particularly preferably used.

The RF-ID tag is composed of an IC chip, and an antenna connected to the IC chip.

The thermally reversible recording component has the recording layer that can reversibly display information and the information storage device. For a preferred example of the information storage device, RF-ID tags are exemplified.

Figure 6:
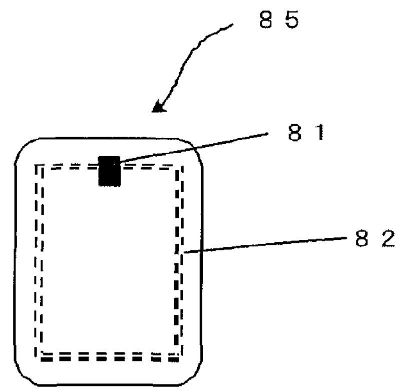
FIG. 6 is a schematic illustration showing one example of an RF-ID tag.

FIG. 6 is a schematic illustration showing one example of an RF-ID tag. An RF-ID tag 85 is composed of an IC chip 81 and an antenna 82 connected to the IC chip 81. The IC chip 81 is sectioned into four sections of a storage unit, a power source controlling unit, a transmitting unit, and a receiving unit, and each of these units takes partial charge of functions to transmit information. An antenna between the RF-ID tag 85 and a reader/writer communicates information via radio waves to thereby exchange data. Specifically, there are two types of electromagnetic induction method and radio wave method. In the electromagnetic induction method, the antenna 82 in the RF-ID tag 85 receives radio waves, and an electromotive force is generated by electromagnetic induction, causing parallel resonance. In the radio wave method, the IC chip is activated by a radiation electromagnetic field. In both of the methods, the IC chip 81 in the RF-ID tag 85 is activated by an external electromagnetic field, information in the chip is converted to signals, and then the signals are sent out from the RF-ID tag 85. The information is received by the antenna provided at the reader/writer and identified by a data processing unit, and the data is processed by software.

The RF-ID tag is formed in a label or card form and can be affixed to the thermally reversible recording medium. The RF-ID tag can be affixed to the surface of the recording medium with a recording layer formed thereon or the surface of the recording medium with a back layer formed thereon, however, it is preferably affixed to the back layer-formed surface.

To bond the RF-ID tag to the thermally reversible recording medium, a known adhesive or a pressure sensitive adhesive can be used.

Further, the thermally reversible recording medium and the RF-ID tag may be formed by lamination to be integrated into a card form or a tag form.

Hereinafter, one example of the way to use the thermally reversible recording component prepared by combining the thermally reversible recording medium with the RF-ID tag in process management will be described.

In a process line in which a container containing a delivered raw material is conveyed, a writing unit configured to write a visible image in a display in non-contact manner while being conveyed, and an erasing unit configured to erase a written image are provided, and further, a reader/writer is provided which is configured to read information in an RF-ID attached to the container by a transmitted electromagnetic wave and to rewrite the information in non-contact manner. Further, in the process line, a controlling unit is provided which is configured to automatically diverging, weighing, controlling materials in a physical distribution system by utilizing individual information units that are read in non-contact manner while the container being conveyed.

In the RF-ID-attached thermally reversible recording medium affixed to the container, information on an article name, numerical quantity etc. is recorded on the thermally reversible recording medium and the RF-ID tag, and inspection is performed. In the subsequent process, a process instruction is given to the delivered raw material, and the information of the process instruction is recorded on the thermally reversible recording medium and the RF-ID tag to prepare a process instruction, and the process instruction is sent to a processing process. Next, for a processed product, order information is recorded as an order instruction on the thermally reversible recording medium and the RF-ID tag. Shipping information is read from a container collected after shipment of the product, and the container and the RF-ID-attached thermally reversible recording medium are to be reused as a container for delivery of materials and an RF-ID-attached thermally reversible recording medium.

Since information is recorded on the thermally reversible recording medium in non-contact manner using a laser, the information can be recorded and erased without peeling off the thermally reversible recording medium from a container or the like, and further, information can be recorded on the RF-ID tag in non-contact manner, the process can be controlled in real time, and the information stored in the RF-ID tag can be concurrently displayed on the thermally reversible recording medium.

(Image Processor)

The image processor of the present invention is used in the image processing method of the present invention, and has at least a laser beam emitting unit and a laser light irradiation intensity controlling unit and further has other components suitably selected in accordance with necessity.

-Laser Beam Emitting Unit-

The laser beam is emitted from a laser oscillator serving as the laser beam emitting unit. The laser beam emitting unit is not particularly limited and may be suitably selected in accordance with the intended use. For example, commonly used lasers such as $CO_2$ lasers, YAG lasers, fiber lasers, laser diodes (LDs) are exemplified.

The laser oscillator is needed to obtain a laser beam having a high-light intensity and high-directivity. For example, a mirror is located at both sides of a laser medium, the laser medium is pumped to supply energy, the number of atoms in an excited state is increased to form an inverted distribution and excite induced emission. Then, only light beams in the optical axis direction are selectively amplified, and the directivity of the light beams is increased, thereby a laser beam is emitted from the output mirror.

The wavelength of a laser beam emitted from the laser beam emitting unit is not particularly limited and may be suitably selected in accordance with the intended use, however, the laser preferably has a wavelength ranging from the visible range to the infrared range, and more preferably has a wavelength ranging from the near-infrared range to the infrared range in terms of improvement in image contrast.

In the visible range, because additives used for absorbing the laser beam and generating heat to record and erase an image on the thermally reversible recording medium is colored, the image contrast may be reduced.

Since the wavelength of a laser beam emitted from the $CO_2$ laser is 10.6 μm within the far-infrared region and the thermally reversible recording medium absorbs the laser beam, there is no need to add additives used for absorbing the laser beam and generating heat to record and erase an image on the thermally reversible recording medium. Further, the additives sometimes absorb a visible light in a small amount even when a laser beam having a wavelength within the near-infrared range is used. Thus, the $CO_2$ laser that needs no addition of the additives has an advantage in that it can prevent reduction in image contrast.

A wavelength of a laser beam emitted from the YAG laser, the fiber laser or the LD ranges from the visible range to the near-infrared range (several hundreds micrometers to 1.2 μm). Because an existing thermally reversible recording medium does not absorb laser beam within the wavelength range, it is necessary to add a photothermal conversion material for absorbing a laser beam and converting it into heat. However, these lasers respectively have an advantage in that a highly fine image can be recorded because of the short wavelength thereof.

Further, because the YAG laser and the fiber laser are high-power lasers, they have an advantage in that image recording and image erasing can be speeded up. Since the LD is small in size, it is advantageous in that it enables down-sizing of the equipment and low-production cost.

-Light Irradiation Intensity Controlling Unit-

The light irradiation intensity controlling unit has a function to change a light irradiation intensity of the laser beam.

A location aspect of the light irradiation intensity controlling unit is not particularly limited as long as the light irradiation intensity controlling unit is located on an optical path of a laser beam emitted from the laser beam emitting unit. A distance between the light irradiation intensity controlling unit and the laser beam emitting unit may be suitably adjusted in accordance with the intended use, however, it is preferable that the light irradiation intensity controlling unit be located in between the laser beam emitting unit and a galvanomirror which will be described hereinafter, and it is more preferable that the light irradiation intensity controlling unit be located in between a beam expander which will be described hereinafter and the galvanomirror.

The light irradiation intensity controlling unit preferably has a function to change a light intensity distribution of the laser beam, from a Gauss distribution, to a light intensity distribution in which the light intensity at a center portion is to be lower than the light intensity in peripheral portions thereof and a light irradiation intensity $I_1$ at the center portion of the irradiated laser beam and a light irradiation intensity $I_2$ on an 80% light energy bordering surface to the total light energy of the irradiated laser beam satisfy the expression, $0.40 \leqq I_1/I_2 \leqq 2.00$. With use of such a light irradiation intensity controlling unit, it is possible to prevent deterioration of the thermally reversible recording medium due to repeated recording and erasing and to improve the repetitive durability of the recording medium with maintaining an image contrast.

The light irradiation intensity controlling unit is not particularly limited and may be suitably selected in accordance with the intended use, however, for example, lenses, filters, masks, mirrors and fiber-coupling devices are preferably exemplified. Of these, lenses are preferable because they have less energy loss. For the lens, a collide scope, an integrator, a beam homogenizer, an aspheric beam shaper (a combination of an intensity conversion lens and a phase correction lens), an aspheric device lens, a diffractive optical element or the like can be preferably used. In particular, aspheric device lenses and diffractive optical elements are preferable.

When a filter or a mask is used, the light irradiation intensity can be controlled by physically cutting a center part of the laser beam. When a mirror is used, the light irradiation intensity can be controlled by using a deformable mirror which is capable of mechanically changing the shape of a light beam in conjunction with a computer or a mirror whose reflectance or surface convexoconcaves can be partially changed.

In the case of a laser having an oscillation wavelength of near-infrared light or visible light, it is preferable to use it because the light irradiation intensity can be easily controlled by fiber-coupling. Examples of the laser having an oscillation wavelength of near-infrared light or visible light include laser diodes and solid lasers.

The method of controlling a light irradiation intensity using the light irradiation intensity controlling unit will be described below in the description of the image processor of the present invention.

Hereinafter, one example of a method of controlling the light irradiation intensity using an aspheric beam shaper as the light irradiation intensity controlling unit will be described.

Figure 7A:
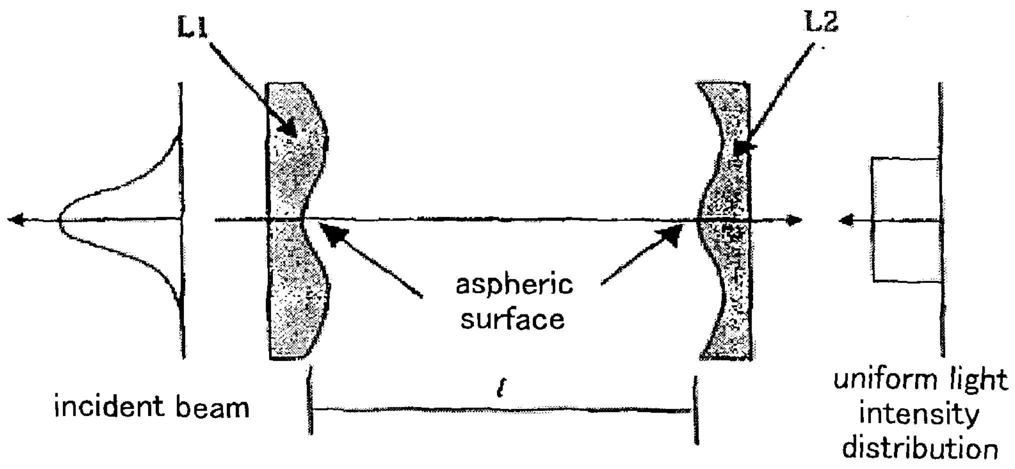
FIG. 7A is a schematic illustration showing one example of a light irradiation intensity controlling unit used in an image processor of the present invention.

When a combination of an intensity conversion lens and a phase correction lens is used, as shown in FIG. 7A, two aspheric lenses are arranged on an optical path of a laser beam emitted from the laser beam emitting unit. Then, the light intensity is changed by a first aspheric lens L1 from a target position (distance 1) so that a ratio $I_1/I_2$ is smaller than that in a Gauss distribution (in FIG. 7A, a light intensity distribution is in a flat top-shaped pattern). Thereafter, to make the light intensity-changed laser beam parallely transmitted, the phase is corrected by means of a second aspheric lens L2. As a result, the light intensity distribution expressed as the Gauss distribution can be converted.

Figure 7B:
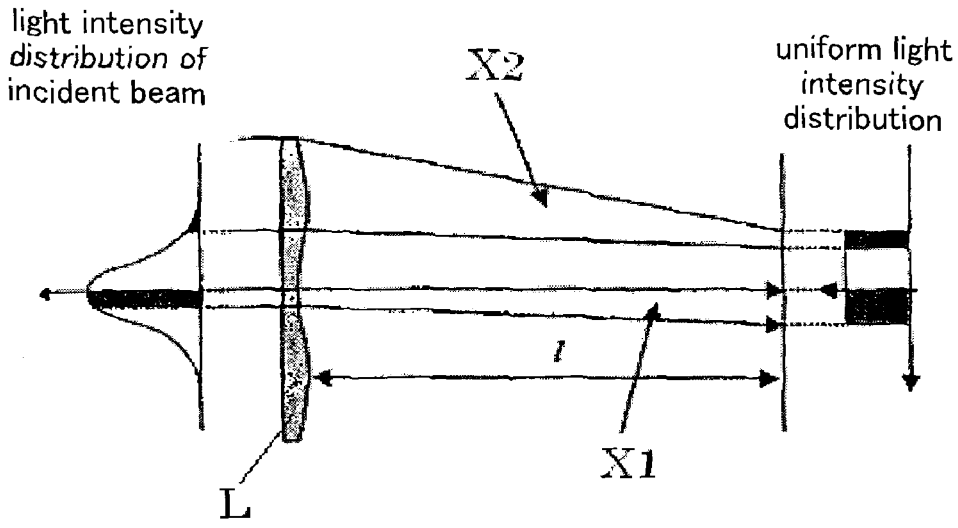
FIG. 7B is a schematic illustration showing another example of a light irradiation intensity controlling unit used in an image processor of the present invention.

As shown in FIG. 7B, only an intensity conversion lens L may be placed in an optical path of a laser beam emitted from the laser beam emitting unit. In this case, for the incident beam (laser beam) expressed as the Gauss distribution, the light irradiation intensity at the center portion in the light intensity distribution can be converted such that the ratio $I_1/I_2$ becomes small (in FIG. 7B a light intensity distribution is in a flat top-shaped pattern) by diffusing the beam as represented by X1 in FIG. 7B at a high-intensity portion (inner portion), and by converging the beam at a weak-intensity portion (outer portion) as represented by X2.

Further, as the light irradiation intensity controlling unit, one example of a method of controlling a light irradiation intensity by means of a combination of a fiber-coupling laser diode and a lens will be explained below.

In a fiber-coupling laser diode, since a laser beam is transmitted in a fiber while repeating reflection, a light intensity distribution of a laser beam emitted from the fiber edge will be different from the Gauss distribution and will be a light intensity distribution corresponding to an intermediate distribution pattern between the Gauss distribution and the flat top-shaped distribution pattern. As a condensing optical system, a combination unit of a plurality of convex lenses and/or concave lenses is attached to the fiber edge so that such a light intensity distribution is converted into the flat top-shaped distribution pattern.

Figure 8:
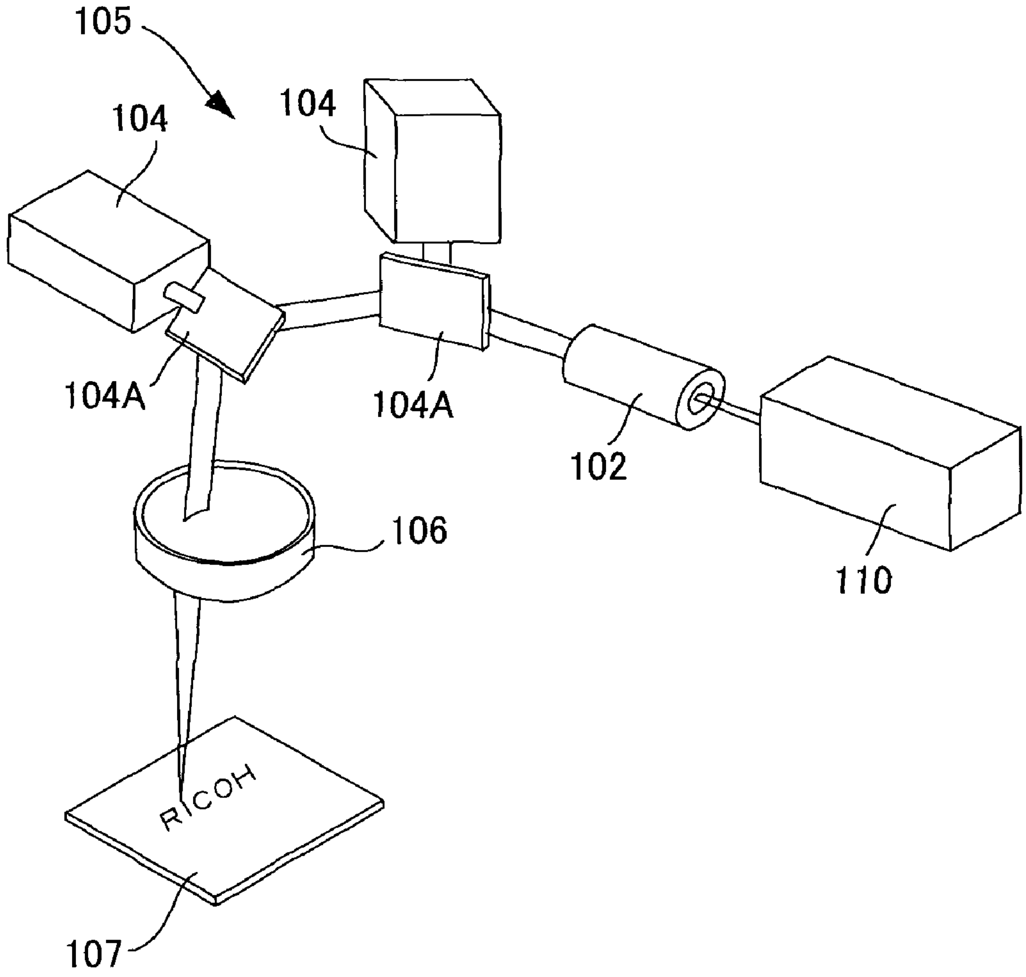
FIG. 8 is a schematic illustration showing one example of an image processor of the present invention.

Here, one example of the image processor of the present invention is shown in FIG. 8, mainly explaining the laser beam emitting unit. In the image processor of the present invention as shown in FIG. 8, for example, a mask (not shown) for cutting a center part of a laser beam is incorporated as the light irradiation intensity controlling unit in an optical path of a laser maker having a $CO_2$ laser of output power of 40 W (LP-440, manufactured by SUNX Co., Ltd.) to allow for controlling a light intensity distribution on a cross-section in the perpendicular direction to the proceeding direction of the laser beam so that the light irradiation intensity at the center portion in the light intensity distribution changes to the light irradiation intensity of the peripheral portions.

The specification of an image-recording/erasing head part in the laser beam emitting unit is as follows: available laser output range: 0.1 W to 40 W; irradiation distance movable range: not particularly limited; spot diameter: 0.18 mm to 10 mm; scanning speed range: 12,000 mm/s at the maximum; irradiation distance: 110 mm×110 mm; and focal distance: 185 mm.

The image processor is equipped with at least the laser beam emitting unit and the light irradiation intensity controlling unit and may be further equipped with an optical unit, a power source controlling unit and a program unit.

The optical unit is composed of a laser oscillator 110 as a laser beam emitting unit, a beam expander 102, a scanning unit 105, and an fθ lens 106.

The beam expander 102 is an optical member in which a plurality of lenses are arranged, is located in between the laser oscillator 110 as the laser beam emitting unit and galvanomirror to be described hereinafter, and is configured to expand a laser beam emitted from the laser oscillator 110 in a radius direction so as to establish substantially parallel laser beam.

The expansion rate of the laser beam is preferably ranging from 1.5 times to 50 times, and the beam diameter at that time is preferably 3 mm to 50 mm.

The scanning unit 105 is composed of a galvanometer 104 and galvanomirrors 104A mounted to the galvanometer 104. The two galvanomirrors 104A attached in an X axis direction and a Y axis direction on the galvanometer 104 are driven to rotationally scan a laser beam at high-velocity, thereby images can be recorded or erased on a thermally reversible recording medium 107. To enable image recording and image erasing by photo-scanning at high-velocity, it is preferable to employ galvanomirror scanning method. The size of the galvanomirrors depends on the beam diameter of the parallel laser beam expanded by the beam expander, and it is preferably in the range of 3 mm to 60 mm and more preferably 6 mm to 40 mm.

When the beam diameter of the parallel beam is excessively reduced, the spot diameter of the laser beam condensed through the use of an fθ lens may not be sufficiently reduced. In the meanwhile, when the beam diameter of the parallel laser beam is excessively increased, the galvanomirrors need to be increased in size, and the laser beam may not be scanned at high velocity.

The fθ lens 106 is a lens to make a laser beam rotationally scanned at an equiangular velocity by the galvanomirrors 104A attached to the galvanometer 104 move at a constant velocity on the surface of the thermally reversible recording medium 107.

The power source controlling unit is composed of an electricity discharging power source (in the case of $CO_2$ laser) or a driving power source for a light source that excites a laser medium (YAG laser etc.), a driving power source for a galvanometer, a cooling power source such as peltiert device, a controlling unit configured to entirely control the operations of the image processor, and the like.

The program unit is a unit used to input conditions of laser beam intensity, laser beam scanning speed and the like for the purpose of recording or erasing images by inputting information with a touch panel or a keyboard and is also used to form and edit characters and the like to be recorded.

The image processing method and the image processor respectively allow for repeatedly recording and erasing a high-contrast image at high speed on a thermally reversible recording medium such as a label affixed to a container like corrugated fiberboard in a non-contact manner and allows for preventing deterioration of the thermally reversible recording medium due to repeated recording and erasing. Therefore, the image processing method and the image processor of the present invention can be particularly suitably used in logistical/physical distribution systems. In this case, for example, an image can be recorded and erased on the label while moving the corrugated fiberboard placed on a belt conveyer. Thus, the image processing method and the image processor enable shortening shipping time because there is no need to stop production lines. The corrugated fiberboard with the label attached thereto can be reused just as it is without peeling off the label therefrom, and an image can be erased and recorded again on the corrugated fiberboard.

Further, since the image processor has the light irradiation intensity controlling unit configured to change a light irradiation intensity of a laser beam, it can effectively prevent deterioration of the thermally reversible recording medium due to repeated recording and erasing of images.

EXAMPLES

Hereinafter, the present invention will be further described in detail with reference to Examples of the present invention, however, the present invention is not limited to the disclosed Examples.

Production Example 1

<Preparation of Thermally Reversible Recording Medium>

A thermally reversible recording medium capable of reversibly changing in color tone between a transparent state and a color developed state depending on temperature was prepared as follows.

-Substrate-

As a substrate, a white turbid polyester film of 125 μm in thickness (TETRON FILM U2L98W, manufactured by TEIJIN DUPONT FILMS JAPAN LTD.) was used.

-Under Layer-

To 40 parts by mass of water, 30 parts by mass of a styrene-butadiene copolymer (PA-9159, manufactured by Nippon A & L Inc.), 12 parts by mass of a polyvinyl alcohol resin (POVAL PVA103, manufactured by KURARAY Co., Ltd.), and 20 parts by mass of a hollow particle (MICROSPHERE-300, manufactured by Matsumoto Yushi-Seiyaku Co., Ltd.) were added to prepare an under layer coating solution.

Next, the obtained under layer coating solution was applied over a surface of the substrate using a wire bar, and the applied coating solution was heated at 80° C. for 2 minutes and dried to thereby form an under layer having a thickness of 20 μm.

- Reversible thermosensitive recording layer (recording layer)-

Five parts by mass of a reversible developer represented by the following Structural Formula (1), 0.5 parts by mass of a color-erasing accelerator represented by the following Structural Formula (2), 0.5 parts by mass of a color-erasing accelerator represented by the following Structural Formula (3), 10 parts by mass of 50% by mass of acrylpolyol solution (hydroxyl group value: 200 mgKOH/g) and 80 parts by mass of methylethylketone were pulverized and dispersed in a ball mill until the average particle diameter became about 1 μm.

Structural Formula (1)

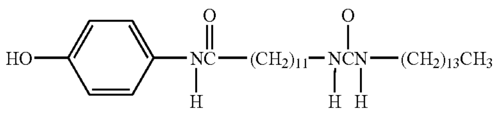

(Reversible developer)

Structural Formula (2)

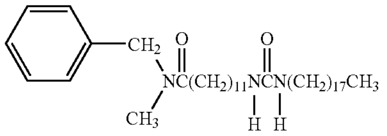

(Color-erasing accelerator)

$C_{17}H_{35}CONHC_{18}H_{35}$ Structural Formula (3)

Next, in the dispersion liquid in which the reversible developer had been pulverized and dispersed, 1 part by mass of 2-anilino-3-methyl-6-dibutylaminofluoran as the leuco dye, 0.2 parts by mass of a phenol antioxidant represented by the following Structural Formula (4) (IRGANOX 565, manufactured by Chiba Specialty Chemicals K.K.), 0.03 parts by mass of a photothermal conversion material (EXCOLOR IR-14, manufactured by NIPPON SHOKUBAI CO., LTD.) and 5 parts by mass of isocyanate (COLLONATE HL, manufactured by Nippon Polyurethane Industry Co., Ltd.) were added, and the materials were substantially stirred to prepare a recording layer coating solution.

Structural Formula (4)

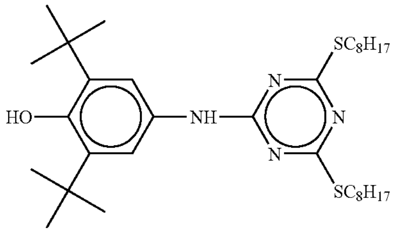

Next, the obtained recording layer coating solution was applied over the surface of the substrate with the under layer formed thereon using a wire bar, and the applied coating solution was heated at 100° C. for 2 minutes, dried and then cured at 60° C. for 24 hours to thereby form a recording layer having a thickness of 11 μm.

-Intermediate Layer-

Three parts by mass of 50% by mass acrylpolyol resin solution (LR327, manufactured by Mitsubishi Rayon Co., Ltd.), 7 parts by mass of 30% by mass zinc oxide fine particle dispersion liquid (ZS303, manufactured by Sumitomo Cement Co., Ltd.), 1.5 parts by mass of isocyanate (COLLONATE HL, manufactured by Nippon Polyurethane Industry Co., Ltd.) and 7 parts by mass of methylethylketone were substantially stirred to prepare an intermediate layer coating solution.

Next, over the surface of the substrate with the under layer and the recording layer formed thereon, the intermediate coating solution was applied using a wire bar, and the applied coating solution was heated at 90° C. for 1 minute, dried, and then heated at 60° C. for 2 hours to thereby form an intermediate layer having a thickness of 2 μm.

-Protective Layer-

Three parts by mass of pentaerythritol hexaacrylate (KAYARAD DPHA, manufactured by Nippon Kayaku Co., Ltd.), 3 parts by mass of urethane acrylate oligomer (ART RESIN UN-3320HA, manufactured by Negami Chemical Industrial Co., Ltd.), 3 parts by mass of acrylic ester of dipentaerithritol caprolactone (KAYARAD DPCA-120, manufactured by Nippon Kayaku Co., Ltd.), 1 part by mass of silica (P-526, manufactured by Mizusawa Chemical Industries Co., Ltd.), 0.5 parts by mass of a photopolymerization initiator (IRGACURE 184, manufactured by Chiba Geigy Japan Co., Ltd.) and 11 parts by mass of isopropyl alcohol were stirred in a ball mill and dispersed until the average particle diameter became about 3 μm to prepare a protective layer coating solution.

Next, over the surface of the substrate with the under layer, the recording layer and the intermediate layer formed thereon, the protective layer coating solution was applied using a wire bar, and the applied coating solution was heated at 90° C. for 1 minute, dried and then crosslinked by means of an ultraviolet lamp of 80 W/cm to thereby form a protective layer having a thickness of 4 μm.

-Back Layer-

In a ball mill, 7.5 parts by mass of pentaerythritol hexaacrylate (KARAYAD DPHA, manufactured by Nippon Kayaku Co., Ltd.), 2.5 parts by mass of urethane acrylate oligomer (ART RESIN UN-3320HA, manufactured by Negami Chemical Industrial Co., Ltd.), 2.5 parts by mass of a needle-like conductive titanium oxide (FT-3000, manufactured by ISHIHARA INDUSTRY CO., LTD., major axis=5.15 μm, minor axis=0.27 μm, composition: titanium oxide coated with antimony-doped tin oxide), 0.5 parts by mass of a photopolymerization initiator (IRGACURE 184, manufactured by Chiba Geigy Japan Co., Ltd.) and 13 parts by mass of isopropyl alcohol were substantially stirred to prepare a back layer coating solution.

Next, over the opposite surface of the substrate from the surface on which the recoating layer, the intermediate layer and the protective layer had been formed, the back layer coating solution was applied using a wire bar, and the applied coating solution was heated at 90° C. for 1 minute, dried and then crosslinked by means of an ultraviolet lamp of 80 W/cm to thereby form a back layer having a thickness of 4 μm. With the above-mentioned treatments, a thermally reversible recording layer of Production Example 1 was prepared.

Production Example 2

<Preparation of Thermally Reversible Recording Medium>

A thermally reversible recording medium capable of reversibly changing in color tone between a transparent state and a color developed state depending on temperature was prepared as follows.

-Substrate-

As a substrate, a transparent PET film of 175 μm in thickness (LUMILAR 175-T12, manufactured by Toray Industries, Inc.) was used.

-Reversible Thermosensitive Recording Layer (Recording Layer)-

In a resin solution in which 26 parts by mass of vinyl chloride copolymer (M110, manufactured by ZEON CORPORATION) had been dissolved in 210 parts by mass of methylethylketone, and 3 parts by mass of an organic low-molecular material represented by the following Structural Formula (5) and 7 parts by mass of dococyl behenate were added. A ceramic bead having a diameter of 2 mm was put in a glass bottle, and the prepared solution was poured thereto.

The solution was dispersed using a paint shaker (manufactured by Asada Tekko Co., Ltd.) for 48 hours to prepare a uniform dispersion liquid.

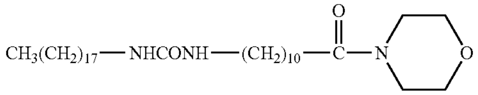

Structural Formula (5)

Next, to the obtained dispersion liquid, 0.07 parts by mass of a photothermal conversion material (EXCOLOR IR-14, manufactured by NIPPON SHOKUBAI CO., LTD.) and 4 parts by mass of an isocyanate compound (COLLONATE 2298-90T, manufactured by Nippon Polyurethane Industry Co., Ltd.) were added to prepare a thermosensitive recording layer coating solution.

Next, over the surface of the substrate (PET film adhesive layer having a magnetic recording layer), the obtained thermosensitive recording layer coating solution was applied, and the applied coating solution was heated, dried and then stored under a temperature of 65° C. for 24 hours so as to be crosslinked, thereby forming a thermosensitive recording layer having a thickness of 10 μm.

-Protective Layer-

A solution composed of 10 parts by mass of 75% by mass butyl acetate solution of urethane acrylate ultraviolet curable resin (UNIDICK C7-157, manufactured by Dainippon Ink and Chemicals, Inc.) and 10 parts by mass of isopropyl alcohol was applied over the thermosensitive recording layer using a wire bar, heated, dried and then irradiated with ultraviolet ray using a high-pressure mercury lamp of 80 W/cm to be cured, thereby forming a protective layer having a thickness of 3 μm. With the above-mentioned treatments, a thermally reversible recording medium of Production Example 2 was prepared.

Production Example 3

-Preparation of Thermally Reversible Recording Medium-

A thermally reversible recording medium of Production Example 3 was prepared in the same manner as in Production Example 1 except that the photothermal conversion material used in Production Example 3 was not used in the preparation of the thermally reversible recording medium.

Production Example 4

A thermally reversible recording medium of Production Example 4 was prepared in the same manner as in Production Example 2 except that the photothermal conversion material used in Production Example 2 was not used in the preparation of the thermally reversible recording medium.

(Evaluation Method)

<Measurement of Laser Beam Intensity Distribution>

A laser beam intensity distribution was measured according to the following procedures.

When a laser diode device was used as a laser, first a laser beam analyzer (SCORPION SCOR-20SCM, manufactured by Point Grey Research Co.) was set such that the irradiation distance was adjusted at the same position as in recording on the thermally reversible recording medium, the laser beam was attenuated using a beam splitter composed of a transmission mirror in combination with a filter (BEAMSTAR-FX-BEAM SPLITTER, manufactured by OPHIR Co.) so that the output power of the laser beam was $3\times10^{-6}$, and a light intensity of the laser beam was measured using the laser beam analyzer. Next, the obtained laser beam intensity was three-dimensionally graphed to thereby obtain a light intensity distribution of the laser beam.

When a $CO_2$ laser device was used as a laser, a laser beam emitted from the $CO_2$ laser device was attenuated using a Zn—Se wedge (LBS-100-IR-W, manufactured by Spiricon Inc.) and a $CaF_2$ filter (LBS-100-IR-F, manufactured by Spiricon Inc.), and a light intensity of the laser beam was measured using a high-powered laser beam analyzer (LPK-$CO_2$-16, manufactured by Spiricon Inc.).

<Measurement of Reflectance Density>

A reflectance density was measured as follows. A gray scale image was retrieved on a Gray Scale (manufactured by Kodak AG.) with a scanner (CANOSCAN4400, manufactured by Canon Inc.), the obtained digital gray scale values were correlated with density values measured by means of a reflectance densitometer (RD-914, manufactured by Macbeth Co.). Specifically, a gray scale image of an erased portion where an image had been recorded and then erased was retrieved with the scanner, and then a digital gray scale value of the obtained gray scale image was converted into a density value, and the density value was regarded as a reflectance density value.

In the present invention, when a thermally reversible recording medium having a thermally reversible recording layer which contained a resin and an organic low-molecular material was evaluated, and the density of an erased portion was 0.15 or more, it was recognized that it was possible to erase the recorded image, and when a thermally reversible recording medium having a thermally reversible recording layer which contained a leuco dye and a reversible developer was evaluated, and the density of an erased portion was 0.15 or less, it was recognized that it was possible to erase the recorded image. Note that in the case of a thermally reversible recording medium having a thermally reversible recording layer which contained a resin and an organic low-molecular material, a reflectance density was measured after setting a black paper sheet (O.D. value=1.7) under the thermally reversible recording medium.

Example 1

Image processing was performed as described below using the thermally reversible recording medium of Production Example 1, and repetitive durability of the thermally reversible recording medium was evaluated. Table 1 shows the evaluation results. The image recording and the image erasing were performed with keeping a peripheral temperature of the thermally reversible recording medium at 25° C.

<Image Recording Step>

As a laser, a fiber coupling high-powered laser diode device of 140 W equipped with a condenser optical system f100 (NBT-S140mk II, manufactured by Jena Optics GmbH; center wavelength: 808 nm, optical fiber core diameter: 600 μm, and lens NA: 0.22) was used, and the laser diode device was controlled so that the output power of the laser beam was 10 W, the irradiation distance was 91.0 mm and the spot diameter was about 0.55 mm. Using the laser diode device, a straight line was recorded on the thermally reversible recording medium of Production Example 1 at a feed rate of 1,200 mm/s of the XY stage in accordance with the recording method as shown in FIG. 9.

Figure 9:
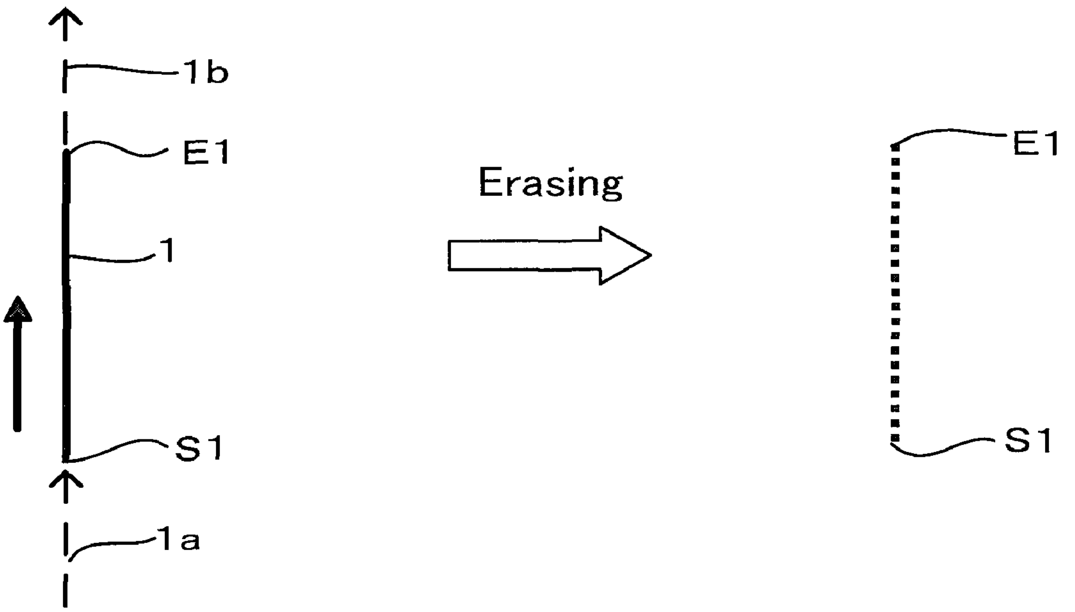
FIG. 9 left view is an illustration showing one example a recording method according to the image recording step in the image processing method of the present invention.

Specifically, as shown in FIG. 9, a first auxiliary line 1a extended by a predetermined distance from a start point S1 of an image line 1 in the opposite direction from a scanning direction D1 and a second auxiliary line 1b extended by a predetermined distance from an end point E1 of the image line 1 in the scanning direction D1 were prepared, and when the first and second auxiliary lines including the image line 1 were continuously scanned from the start point of the first auxiliary line 1*a* to the end point of the second auxiliary line 1*b*, the image line 1 was scanned with irradiating the laser beam, and the first auxiliary line 1*a* and the second auxiliary line 1*b* were scanned without irradiating the laser beam to thereby record the image. The scanning time of the first auxiliary line 1*a* and the scanning time of the second auxiliary line 1*b* was 1 ms.

At that time, a light intensity distribution of the laser beam was measured, and a ratio $I_1/I_2$ in the light intensity distribution was 1.75.

<Image Erasing Step>

Subsequently, the laser diode device was controlled so that the output power of the laser beam was 15 W, the irradiation distance was 86 mm, and the spot diameter was 3.0 mm, and the straight line image recorded on the thermally reversible recording medium was erased using the laser diode device at a feed rate of the XY stage, 1,200 mm/s.

<Evaluation of Repetitive Durability>

The image recording step and the image erasing step were repeatedly performed, and reflection densities at the start point, the end point and the straight portion of the erased portion on the thermally reversible recording medium were measured at every 10-time intervals of the image recording/image erasing, and the number of erasing times just before the recorded image could not be completely erased was determined. Table 1 shows the evaluation results.

Example 2

Image recording and image erasing were performed in the same manner as in Example 1 except that the thermally reversible recording medium of Production 2 was used instead of the thermally reversible recording medium of Production Example 1, the output power of the laser beam in the image recording step was changed to 8.0 W, and the output power of the laser beam in the image erasing step was changed to 12 W. Repetitive durability of the thermally reversible recording medium was evaluated in the same manner as in Example 1. Table 1 shows the evaluation results.

Example 3

[Image Recording Step]

Using a laser marker equipped with a $CO_2$ laser of output power of 40 W (LP-440, manufactured by SUNX Co., Ltd.), a mask for cutting a center part of a laser beam was incorporated in the optical path of the laser beam, and the laser marker was controlled so that a ratio of $I_1/I_2$ was 1.60 in the light irradiation distribution of the laser beam.

Next, the laser marker was controlled so that the output power of the laser beam was 14.0 W, the irradiation distance was 198 mm, the spot diameter was 0.65 mm and the scanning speed was 1,000 mm/s. Using the laser device, an image array of twenty characters "A" was recorded on the thermally reversible recording medium of Production Example 3 according to the recording method as illustrated in FIG. 3A left view.

Specifically, as illustrated in FIG. 3A left view, a first auxiliary line 1*a* extended by a predetermined distance from a start point S1 of an image line 1 in the opposite direction from a scanning direction D1 and a second auxiliary line 1*b* extended by a predetermined distance from an end point E1 of the image line 1 in the scanning direction D1 were prepared, and when the first auxiliary line 1*a* and second auxiliary line 1*b* including the image line 1 were continuously scanned from the start point of the first auxiliary line 1*a* to the end point of the second auxiliary line 1*b*, the image line 1 was scanned with irradiating the laser beam, and the first auxiliary line 1*a* and the second auxiliary line 1*b* were scanned without irradiating the laser beam to thereby record the image. The scanning time of the first auxiliary line 1*a* was 0.3 ms and the scanning time of the second auxiliary line 1*b* was 0.3 ms.

Next, as illustrated in FIG. 3A left view, a first auxiliary line 2*a* extended by a predetermined distance from a start point S2 of an image line 2 in the opposite direction from a scanning direction D2 and a second auxiliary line 2*b* extended by a predetermined distance from an end point E2 of the image line 2 in the scanning direction D2 were prepared, and when the first auxiliary line 2*a* and second auxiliary line 2*b* including the image line 2 were continuously scanned from the start point of the first auxiliary line 2*a* to the end point of the second auxiliary line 2*b*, the image line 2 was scanned with irradiating the laser beam, and the first auxiliary line 2*a* and the second auxiliary line 2*b* were scanned without irradiating the laser beam to thereby record the image. The scanning time of the first auxiliary line 2*a* was 0.3 ms and the scanning time of the second auxiliary line 2*b* was 0.3 ms.

Next, as illustrated in FIG. 3A left view, a first auxiliary line 3*a* extended by a predetermined distance from a start point S3 of an image line 3 in the opposite direction from a scanning direction D3 and a second auxiliary line 3*b* extended by a predetermined distance from an end point E3 of the image line 3 in the scanning direction D3 were prepared, and when the first auxiliary line 3*a* and second auxiliary line 3*b* including the image line 3 were continuously scanned from the start point of the first auxiliary line 3*a* to the end point of the second auxiliary line 3*b*, the image line 3 was scanned with irradiating the laser beam, and the first auxiliary line 3*a* and the second auxiliary line 3*b* were scanned without irradiating the laser beam to thereby record the image. The scanning time of the first auxiliary line 3*a* was 0.3 ms and the scanning time of the second auxiliary line 3*b* was 0.3 ms.

Note that the image was recorded in a state where the scanning speed of the laser beam did not attain a substantially uniform motion at the start points and the end points of the image lines 1, 2 and 3 (½ of the uniform motion speed). The time used in the image recording was 0.34 seconds.

<Image Erasing Step>

Subsequently, from the optical path of the laser marker, the mask for cutting a center part of a laser beam was removed, and the laser marker was controlled so that the output power of the laser beam was 22 W, the irradiation distance was 155 mm, the spot diameter was about 2 mm and the scanning speed was 3,000 mm/s. Then, the image array of twenty characters "A" recorded on the thermally reversible recording medium was erased.

<Evaluation of Repetitive Durability>

The image recording step and the image erasing step were repeatedly performed, and reflection densities at the start points, the end points and the straight portions of the erased image of a character "A" on the thermally reversible recording medium were measured. Table 1 shows the evaluation results. The image recording and the image erasing were performed with keeping a peripheral temperature of the thermally reversible recording medium at 25° C.

Example 4

Image recording and image erasing were performed in the same manner as in Example 3 except that recording at the start points and the end points of the image lines 1, 2 and 3 was performed in a state where the scanning speed of the laser beam could be a uniform motion speed. The scanning time of the first auxiliary lines 1*a* to 3*a* was 2.0 ms and the scanning time of the second auxiliary lines of 1*b* to 3*b* was 2.0 ms. The time used in the image recording was 0.46 seconds.

Thereafter, repetitive durability of the thermally reversible recording medium was evaluated in the same manner as in Example 3. Table 1 shows the evaluation results.

Example 5

Image recording and image erasing were performed in the same manner as is Example 3 except that the thermally reversible recording medium of Production Example 4 was used instead of the thermally reversible recording medium of Production Example 3, the output power of the laser beam in the image recording step was changed to 9.8 W, and the output power of the laser beam in the image erasing step was changed to 15.0 W. Repetitive durability of the thermally reversible recording medium was evaluated. Table 1 shows the evaluation results.

Example 6

<Image Recording Step>

As a laser, a fiber coupling high-powered laser diode device of 140 W equipped with a condenser optical system f100 (LIMO25-F100-DL808 manufactured by LIMO; center wavelength: 808 nm, optical fiber core diameter: 100 μm, and lens NA: 0.11) was used, and the laser diode device was controlled so that the output power of the laser beam was 10 W, the irradiation distance was 150 mm and the spot diameter was about 0.75 mm. Using the laser diode device, an image array of twenty characters "A" was recorded on the thermally reversible recording medium of Production Example 1 at a scanning speed of 1,200 mm/s of a galvanomirror in the same manner as in Example 3.

At that time, a light intensity distribution of the laser beam was measured, and a ratio $I_1/I_2$ in the light intensity distribution was 1.65.

<Image Erasing Step>

Subsequently, the laser diode device was controlled so that the output power of the laser beam was 20 W, the irradiation distance was 195 mm, the spot diameter was 3 mm and the scanning speed was 1,000 mm/s. Then, the recorded image was erased while scanning a laser beam linearly at 0.59 mm intervals.

<Evaluation of Repetitive Durability>

Next, repetitive durability of the thermally reversible recording medium was evaluated in the same manner as in Example 3. Table 1 shows the evaluation results.

Example 7

Image recording and image erasing were performed in the same manner as in Example 6 except that in the recording step, the focal distance was changed to 160 mm and the output power of the laser beam was changed to 11 W.

At that time, a ratio $I_1/I_2$ in the light intensity distribution of the laser beam was 2.00.

Next, repetitive durability of the thermally reversible recording medium was evaluated in the same manner as in Example 6. Table 1 shows the evaluation results.

Example 8

Image recording and image erasing were performed in the same manner as in Example 6 except that in the image recording step, the focal distance was changed to 158 mm, and the output power of the laser beam was changed to 11 W.

At that time, a ratio $I_1/I_2$ in the light intensity distribution of the laser beam was 1.85.

Next, repetitive durability of the thermally reversible recording medium was evaluated in the same manner as in Example 6. Table 1 shows the evaluation results.

Example 9

Image recording and image erasing were performed in the same manner as in Example 6 except that in the image recording step, the focal distance was changed to 145 mm, and the output power of the laser beam was changed to 13 W.

At that time, a ratio $I_1/I_2$ in the light intensity distribution of the laser beam was 0.55.

Next, repetitive durability of the thermally reversible recording medium was evaluated in the same manner as in Example 6. Table 1 shows the evaluation results.

Example 10

Image recording and image erasing were performed in the same manner as in Example 6 except that in the image recording step, the focal distance was changed to 144 mm, and the output power of the laser beam was changed to 14 W.

At that time, a ratio $I_1/I_2$ in the light intensity distribution of the laser beam was 0.40.

Next, repetitive durability of the thermally reversible recording medium was evaluated in the same manner as in Example 6. Table 1 shows the evaluation results.

Example 11

Image recording and image erasing were performed in the same manner as in Example 6 except that the thermally reversible recording medium of Production Example 2 was used instead of the thermally reversible recording medium of Production Example 1, the output power of the laser beam in the image recording step was changed to 8 W, and the output power of the laser beam in the image erasing step was changed to 16 W. Repetitive durability of the thermally reversible recording medium was evaluated in the same manner as in Example 6. Table 1 shows the evaluation results.

Example 12

Image recording and image erasing were performed under the same image recording conditions and image erasing conditions and in the same manner as in Example 3 except that in the image recording step and the image erasing step, a peripheral temperature of the thermally reversible recording medium was kept 30° C. Repetitive durability of the thermally reversible recording medium was evaluated in the same manner as in Example 3. Table 1 shows the evaluation results.

Example 13

Image recording and image erasing were performed under the same image recording conditions and image recording conditions and in the same manner as in Example 3 except that in the image recording step and the image erasing step, a peripheral temperature of the thermally reversible recording medium was kept 30° C., and in the image recording conditions and the image erasing conditions of Example 3, the output power of the laser beam was reduced by 10% to thereby perform the image recording and image erasing.

Repetitive durability of the thermally reversible recording medium was evaluated in the same manner as in Example 3. Table 1 shows the evaluation results.

Comparative Example 1

Image recording and image erasing were performed in the same manner as in Example 3 except that in the recording step, an image array of twenty characters of "A" was recorded in accordance with the recording method as illustrated in FIG. 3B left view. Repetitive durability of the thermally reversible recording medium was evaluated in the same manner as in Example 3. Table 1 shows the evaluation results.

In the recording method as illustrated in FIG. 3B left view, the thermally reversible recording medium was irradiated with a laser beam, and an image line 11 was recorded in a D1 direction. The image line 11 was recorded with being continuously recorded at a folding portion T1 in a D2 direction. Here, irradiation of the laser beam was stopped, the focal point of the laser beam irradiation was moved to a start point S2 of an image line 12, and the image line 12 was recorded in a D3 direction.

Comparative Example 2

Image recording and image erasing were performed in the same manner as in Example 5 except that in the recording step, an image array of twenty characters of "A" was recorded in accordance with the recording method as illustrated in FIG. 3B left view. Repetitive durability of the thermally reversible recording medium was evaluated in the same manner as in Example 5. Table 1 shows the evaluation results.

In the recording method as illustrated in FIG. 3B left view, the thermally reversible recording medium was irradiated with a laser beam, and an image line 11 was recorded in a D1 direction. The image line 11 was recorded with being continuously recorded at a folding portion T1 in a D2 direction. Here, irradiation of the laser beam was stopped, the focal point of the laser beam irradiation was moved to a start point S2 of an image line 12, and the image line 12 was recorded in a D3 direction.

Comparative Example 3

Image recording and image erasing were performed in the same manner as in Example 6 except that in the image recording step, the focal distance was changed to 163 mm, the output power of the laser beam was changed to 11 W, and recording at the start points and the end points of the image lines 1, 2 and 3 was performed in a state where the scanning speed of the laser beam was a uniform motion speed. At that time, a ratio of $I_1/I_2$ of the light intensity distribution of the laser beam was 2.05.

Next, the image recording step and the image erasing step were repeatedly performed. Repetitive durability of the thermally reversible recording medium was evaluated in the same manner as in Example 6. Table 1 shows the evaluation results.

Comparative Example 4

Image recording and image erasing were performed in the same manner as in Comparative Example 3 except that in the image recording step, the focal distance was changed to 143 mm, and the output power of the laser beam was changed to 14 W. At that time, a ratio of $I_1/I_2$ of the light intensity distribution of the laser beam was 0.34.

Next, the image recording step and the image erasing step were repeatedly performed. Repetitive durability of the thermally reversible recording medium was evaluated in the same manner as in Comparative Example 3. Table 1 shows the evaluation results.

TABLE 1

| | Number of repeatedly rewritable times | | $I_1/I_2$ at the |
|---|---|---|---|
| | At start points, end points and folding portions | At straight line portions | time of recording |
| Ex. 1 | 400 | 480 | 1.75 |
| Ex. 2 | 580 | 630 | 1.75 |
| Ex. 3 | 390 | 460 | 1.60 |
| Ex. 4 | 400 | 460 | 1.60 |
| Ex. 5 | 600 | 640 | 1.60 |
| Ex. 6 | 510 | 550 | 1.65 |
| Ex. 7 | 300 | 350 | 2.00 |
| Ex. 8 | 350 | 420 | 1.85 |
| Ex. 9 | 370 | 440 | 0.55 |
| Ex. 10 | 320 | 380 | 0.40 |
| Ex. 11 | 590 | 640 | 1.65 |
| Ex. 12 | 220 | 350 | 1.60 |
| Ex. 13 | 400 | 460 | 1.60 |
| Compara. Ex. 1 | 60 | 460 | 1.60 |
| Compara. Ex. 2 | 90 | 630 | 1.60 |
| Compara. Ex. 3 | 120 | 220 | 2.05 |
| Compara. Ex. 4 | 180 | 240 | 0.34 |

Hereinafter, the image processing method according to the fourth embodiment of the present invention and the image processor of the present invention will be further described referring to Examples.

Example 14

Using the thermally reversible recording medium of Production Example 1, an image processing was carried out according to the following procedures. Then, repetitive durability of the thermally reversible recording medium was evaluated as follows. Table 2 shows the evaluation results. Note that image recording and image erasing were performed with keeping a peripheral temperature of the thermally reversible recording medium at 25° C.

<Image Recording Step>

As a laser, a fiber coupling high-powered laser diode device of 140 W equipped with a condenser optical system f100 (NBT-S140mk II, manufactured by Jena Optics GmbH; center wavelength: 808 nm, optical fiber core diameter: 600 μm, and lens NA: 0.22) was used, and the laser diode device was controlled so that the output power of the laser beam was 12 W, the irradiation distance was 91.4 mm and the spot diameter was about 0.6 mm. Using the laser diode device, a straight line was recorded on the thermally reversible recording medium of Production Example 1 at a feed rate of 1,200 mm/s of the XY stage in accordance with the recording method as shown in FIG. 9.

Specifically, as shown in FIG. 9 left view, a first auxiliary line 1*a* extended by a predetermined distance from a start point S1 of an image line 1 in the opposite direction from a scanning direction D1 and a second auxiliary line 1*b* extended by a predetermined distance from an end point E1 of the image line 1 in the scanning direction D1 were prepared, and when the first and second auxiliary lines including the image line 1 were continuously scanned from the start point of the first auxiliary line 1*a* to the end point of the second auxiliary line 1*b*, the image line 1 was scanned with irradiating the laser beam, and the first auxiliary line 1*a* and the second auxiliary line 1*b* were scanned without irradiating the laser beam to thereby record the image. The scanning time of the first auxiliary line 1*a* was 1 ms, and the scanning time of the second auxiliary line 1*b* was 1 ms.

Figure 11:
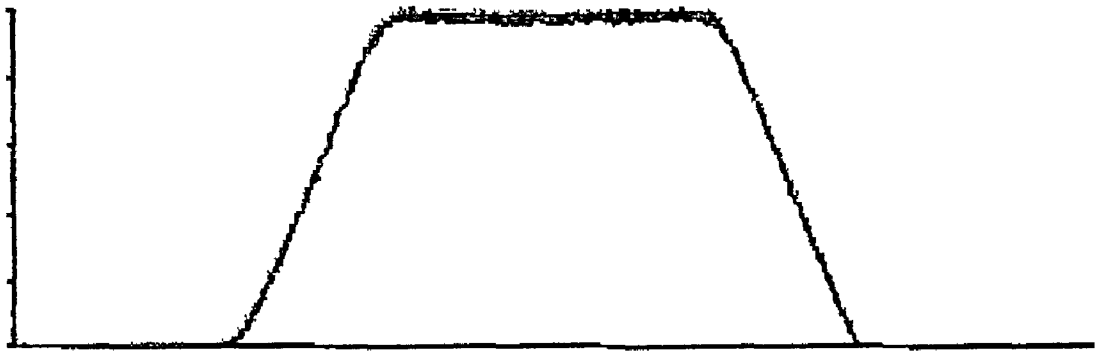
FIG. 11 is a schematic illustration showing a light intensity distribution on a cross-section of a laser beam in the perpendicular direction to the proceeding direction of the laser beam used in the image recording step in Example 14.

At that time, a light intensity distribution on a cross-section in a substantially perpendicular direction to the proceeding direction of the laser beam was measured using a laser beam profiler BEAMON (manufactured by Duma Optronics Ltd.). As a result, a light intensity distribution curve as shown in FIG. 11 was obtained. Further, a differential curve (X') of which the light intensity distribution is differentiated once and a differential curve (X") of which the light intensity distribution is differentiated twice are shown in FIG. 10B. These figures show that the light irradiation intensity at the center portion is 1.05 times the light irradiation intensity at the peripheral portions.

<Image Erasing Step>

Subsequently, the laser diode device was controlled so that the output power of the laser beam was 15 W, the irradiation distance was 86 mm, and the spot diameter was 3.0 mm, and the straight line image recorded on the thermally reversible recording medium was erased using the laser diode device at a feed rate of 1,200 mm/s of the XY stage.

Figure 12:
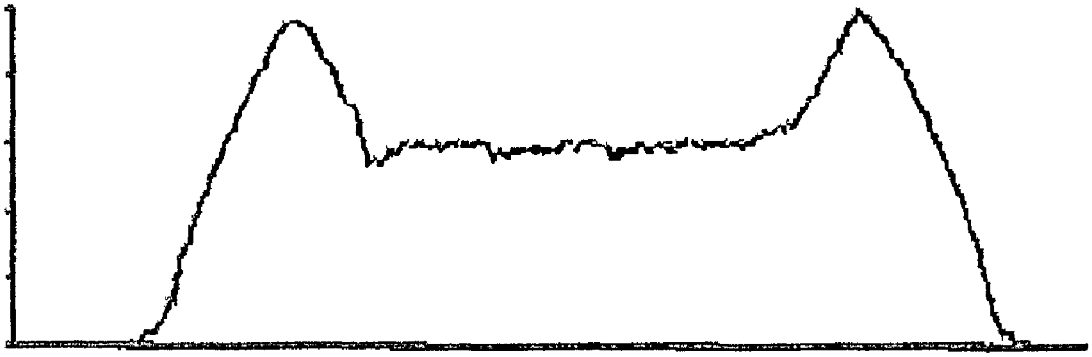
FIG. 12 is a schematic illustration showing a light intensity distribution on a cross-section of a laser beam in the perpendicular direction to the proceeding direction of the laser beam used in the image erasing step in Example 14.

At that time, a light intensity distribution on a cross-section in a substantially perpendicular direction to the proceeding direction of the laser beam was measured using a laser beam profiler BEAMON (manufactured by Duma Optronics Ltd.). As a result, a light intensity distribution curve as shown in FIG. 12 was obtained. Further, a differential curve (X') of which the light intensity distribution is differentiated once and a differential curve (X") of which the light intensity distribution is differentiated twice are shown in FIG. 10D. These figures show that the light irradiation intensity at the center portion is 0.6 times the light irradiation intensity at the peripheral portions.

<Evaluation of Repetitive Durability>

The image recording step and the image erasing step were repeatedly performed 50 times, 300 times and 1,000 times respectively, and the recorded image and erased image at the start point, the end point and the straight portion on the thermally reversible recording medium were evaluated as follows. For the image evaluation method, when a background density, an image density and an erasure density were respectively represented by "Ai", "Ar", and "Ae", the recorded image and erased image were evaluated by calculating the equation, $(Ae-Ai)/(Ar-Ai)=C$. The smaller the value C, the more preferable the repetitive durability is. The each of the images was ranked based on the following criteria. Each of the images was retrieved with a scanner and then subjected to density proof to thereby measure the background density, image density and erasure density.

[Evaluation Criteria]

A: $C<2\%$

B: $2\%\leqq C<10\%$

C: $10\%\leqq C<20\%$

D: $20\%\leqq C$

Example 15

Image recording and image erasing were performed in the same manner as in Example 14 except that the thermally reversible recording medium of Production Example 2 was used instead of the thermally reversible recording medium of Production Example 1, and then repetitive durability of the thermally reversible recording medium was evaluated in the same manner as in Example 14 except that the output power of the laser in the image recording step was changed to 9.5 W, and the output power of the laser in the image erasing step was changed to 12 W. Table 2 shows the evaluation results.

Example 16

<Image Recording Step>

Using a laser marker equipped with a $CO_2$ laser of output power of 40 W (LP-440, manufactured by SUNX Co., Ltd.), a mask for cutting a center part of a laser beam was incorporated in the optical path of the laser beam, and the laser marker was controlled so that in a light intensity distribution on a cross-section in a substantially perpendicular direction to the proceeding direction of the laser beam, the light irradiation intensity at the center portion was 0.5 times the light irradiation intensity at the peripheral portions.

Next, the laser marker was controlled so that the laser output power was 6.5 W, the irradiation distance was 185 mm, the spot diameter was 0.18 mm and the scanning speed was 1,000 mm/s. Using the laser marker, an image array of twenty characters "A" was recorded on the thermally reversible recording medium of Production Example 3 according to the recording method as illustrated in FIG. 3A left view.

Specifically, as illustrated in FIG. 3A left view, a first auxiliary line 1*a* extended by a predetermined distance from a start point S1 of an image line 1 in the opposite direction from a scanning direction D1 and a second auxiliary line 1*b* extended by a predetermined distance from an end point E1 of the image line 1 in the scanning direction D1 were prepared, and when the first auxiliary line 1*a* and the second auxiliary line 1*b* including the image line 1 were continuously scanned from the start point of the first auxiliary line 1*a* to the end point of the second auxiliary line 1*b*, the image line 1 was scanned with irradiating the laser beam, and the first auxiliary line 1*a* and the second auxiliary line 1*b* were scanned without irradiating the laser beam to thereby record the image. The scanning time of the first auxiliary line 1*a* was 0.3 ms and the scanning time of the second auxiliary line 1*b* was 0.3 ms.

Next, as illustrated in FIG. 3A left view, a first auxiliary line 2*a* extended by a predetermined distance from a start point S2 of an image line 2 in the opposite direction from a scanning direction D2 and a second auxiliary line 2*b* extended by a predetermined distance from an end point E2 of the image line 2 in the scanning direction D2 were prepared, and when the first auxiliary line 2*a* and the second auxiliary line 2*b* including the image line 2 were continuously scanned from the start point of the first auxiliary line 2*a* to the end point of the second auxiliary line 2*b*, the image line 2 was scanned with irradiating the laser beam, and the first auxiliary line 2*a* and the second auxiliary line 2*b* were scanned without irradiating the laser beam to thereby record the image. The scanning time of the first auxiliary line 2*a* was 0.3 ms and the scanning time of the second auxiliary line 2*b* was 0.3 ms.

Next, as illustrated in FIG. 3A left view, a first auxiliary line 3*a* extended by a predetermined distance from a start point S3 of an image line 3 in the opposite direction from a scanning direction D3 and a second auxiliary line 3*b* extended by a predetermined distance from an end point E3 of the image line 3 in the scanning direction D3 were prepared, and when the first auxiliary line 3*a* and the second auxiliary line 3*b* including the image line 3 were continuously scanned from the start point of the first auxiliary line 3*a* to the end point of the second auxiliary line 3*b*, the image line 3 was scanned with irradiating the laser beam, and the first auxiliary line 3*a* and the second auxiliary line 3*b* were scanned without irradiating the laser beam to thereby record the image. The scanning time of the first auxiliary line 3*a* was 0.3 ms and the scanning time of the second auxiliary line 3*b* was 0.3 ms.

Note that the image was recorded in a state where the scanning speed of the laser beam did not attain a substantially uniform motion at the start points and the end points of the image lines 1, 2 and 3 (at a scanning speed of ½ of the uniform motion speed). The time used in the image recording was 0.34 seconds.

<Image Erasing Step>

Subsequently, from the optical path of the laser marker, the mask for cutting a center part of a laser beam was removed, and the laser marker was controlled so that the laser output power was 22 W, the irradiation distance was 155 mm, the spot diameter was about 2 mm and the scanning speed was 3,000 mm/s. Then, the image array of twenty characters "A" recorded on the thermally reversible recording medium was erased.

<Evaluation of Repetitive Durability>

The image recording step and the image erasing step were repeatedly performed 50 times, 300 times and 1,000 times, respectively, and the recorded image of the image array of twenty characters "A" and erased image at the start points, the end points and the straight portions on the thermally reversible recording medium were evaluated Then, reflection density at the start points, the end points and the straight line portions of the image which had been erased on the thermally reversible recording medium was measured in the same manner as in Example 14. Table 2 shows the measurement results. Note that a peripheral temperature of the thermally reversible recording medium was kept 25° C. at the time of image recording and image erasing.

Example 17

Image recording and image erasing were performed in the same manner as in Example 16 except that recording of an image array of twenty characters "A" at the start points and the end points of the image lines 1, 2 and 3 was performed in a state where the scanning speed of the laser beam attained a uniform motion. The time used in the image recording was 0.46 seconds.

Subsequently, the repetitive durability of the thermally reversible recording medium was evaluated in the same manner as in Example 16. Table 2 shows the evaluation results.

Example 18

Image recording and image erasing were performed under the same image recording conditions and image erasing conditions and in the same manner as in Example 16 except that in the image recording step and the image erasing step, a peripheral temperature of the thermally reversible recording medium was kept 30° C. Repetitive durability of the thermally reversible recording medium was evaluated in the same manner as in Example 16. Table 2 shows the evaluation results.

Example 19

Image recording and image erasing were performed in the same manner as in Example 16 except that in the image recording step and the image erasing step, a peripheral temperature of the thermally reversible recording medium was kept 30° C., and in the image recording conditions and image recording conditions used of Example 16, the output power of the laser beam was reduced by 10% to thereby perform the image recording and image erasing. Repetitive durability of the thermally reversible recording medium was evaluated in the same manner as in Example 16. Table 2 shows the evaluation results.

Comparative Example 5

Image recording and image erasing were performed in the same manner as in Example 16 except that in the recording step, an image array of twenty characters of "A" was recorded in accordance with the recording method as illustrated in FIG. 3B left view. Repetitive durability of the thermally reversible recording medium was evaluated in the same manner as in Example 16. Table 2 shows the evaluation results.

In the recording method as illustrated in FIG. 3B left view, the thermally reversible recording medium was irradiated with a laser beam, and an image line 11 was recorded in a D1 direction. The image line 11 was recorded with being continuously recorded at a folding portion T1 in a D2 direction. Here, irradiation of the laser beam was stopped, the focal point of the laser beam irradiation was moved to a start point S2 of an image line 12, and the image line 12 was recorded in a D3 direction.

Comparative Example 6

Image recording and image erasing were performed in the same manner as in Example 16 except that in the image recording step, an image array of twenty characters "A" was recorded on the thermally reversible recording medium of Production Example 4 in accordance with the recording method as illustrated in FIG. 3B left view. Repetitive durability of the thermally reversible recording medium was evaluated in the same manner as in Example 16. Table 2 shows the evaluation results.

In the recording method as illustrated in FIG. 3B left view, the thermally reversible recording medium was irradiated with a laser beam, and an image line 11 was recorded in a D1 direction. The image line 11 was recorded with being continuously recorded at a folding portion T1 in a D2 direction. Here, irradiation of the laser beam was stopped, the focal point of the laser beam irradiation was moved to a start point S2 of an image line 12, and the image line 12 was recorded in a D3 direction.

TABLE 2

| | After rewriting 50 times | | After rewriting 300 times | | After rewriting 1,000 times | |
|---|---|---|---|---|---|---|
| | At start points, end points and folding portions | At straight line portions | At start points, end points and folding portions | At straight line portions | At start points, end points and folding portions | At straight line portions |
| Ex. 14 | A | A | A | A | A | A |
| Ex. 15 | A | A | A | A | A | A |
| Ex. 16 | A | A | A | A | A | A |

TABLE 2-continued

| | After rewriting 50 times | | After rewriting 300 times | | After rewriting 1,000 times | |
|---|---|---|---|---|---|---|
| | At start points, end points and folding portions | At straight line portions | At start points, end points and folding portions | At straight line portions | At start points, end points and folding portions | At straight line portions |
| Ex. 17 | A | A | A | A | A | A |
| Ex. 18 | A | A | B | A | C | B |
| Ex. 19 | A | A | A | A | A | A |
| Compara. Ex. 5 | A | A | B | A | C | A |
| Compara. Ex. 6 | A | A | B | A | C | A |

Since the image processing method and the image processor of the present invention allow for repeatedly recording and erasing a high-contrast image at high speed on a thermally reversible recording medium in a non-contact manner and allow for preventing deterioration of the thermally reversible recording medium attributable to repeated image recording and image erasing, the image processing method and the image processor can be widely used in In-Out tickets, stickers for frozen meal containers, industrial products, various medical containers, and large screens and various displays for logistical management application use and production process management application use, and can be particularly suitably used in logistical/physical distribution systems and process management systems in factories.

What is claimed is:

1. An image processing method, comprising:

any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein a light irradiation intensity $I_1$ at a center position of the laser beam irradiated in the image recording and a light irradiation intensity $I_2$ on an 80% light energy bordering surface to the total light energy of the irradiated laser beam satisfy the expression, $0.40 \leqq I_1/I_2 \leqq 2.00$; in the image recording, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

2. The image processing method according to claim 1, wherein in any one of the image recording and the image erasing, at least one of a temperature of the thermally reversible recording medium and a peripheral temperature thereof is detected to control irradiation conditions of the laser beam to be radiated to the thermally reversible recording medium.

3. The image processing method according to claim 1, wherein a time used to scan the first auxiliary line and the second auxiliary line in a state where the laser beam is not irradiated is 0.2 ms to 5 ms.

4. The image processing method according to claim 1, wherein each of the image lines constituting the image is a line constituting any one of a character, a symbol and a diagram.

5. The image processing method according to claim 1, wherein the thermally reversible recording medium has at least a thermally reversible recording layer on a substrate and reversibly changes any one of its transparency and color tone at between a first specific temperature and a second specific temperature that is higher than the first specific temperature.

6. The image processing method according to claim 1, wherein the thermally reversible recording medium has at least a reversible thermosensitive recording layer on a substrate, and the reversible thermosensitive recording layer comprises a resin and an organic low-molecular material.

7. The image processing method according to claim 1, wherein the thermally reversible recording medium has at least a reversible thermosensitive recording layer on a substrate, and the reversible thermosensitive recording layer comprises a leuco dye and a reversible developer.

8. An image processing method, comprising:

any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein in the image recording, a first auxiliary line extended by a predetermined distance from a start point of each of image lines among a plurality of image lines constituting an image in the opposite direction from the scanning direction and a second auxiliary line extended by a predetermined distance from an end point of each of the image lines in the scanning direction are prepared, and when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image, and at the start point and the end point, each of the image lines is recorded in a state where a scanning speed of the laser beam does not attain a substantially uniform motion.

9. The image processing method according to claim 8, wherein in any one of the image recording and the image erasing, at least one of a temperature of the thermally reversible recording medium and a peripheral temperature thereof is detected to control irradiation conditions of the laser beam to be radiated to the thermally reversible recording medium.

10. The image processing method according to claim 8, wherein a time used to scan the first auxiliary line and the second auxiliary line in a state where the laser beam is not irradiated is 0.2 ms to 5 ms.

11. The image processing method according to claim 8, wherein each of the image lines constituting the image is a line constituting any one of a character, a symbol and a diagram.

12. The image processing method according to claim 8, wherein the thermally reversible recording medium has at least a thermally reversible recording layer on a substrate and reversibly changes any one of its transparency and color tone at between a first specific temperature and a second specific temperature that is higher than the first specific temperature.

13. The image processing method according to claim 8, wherein the thermally reversible recording medium has at least a reversible thermosensitive recording layer on a substrate, and the reversible thermosensitive recording layer comprises a resin and an organic low-molecular material.

14. The image processing method according to claim 8, wherein the thermally reversible recording medium has at least a reversible thermosensitive recording layer on a substrate, and the reversible thermosensitive recording layer comprises a leuco dye and a reversible developer.

15. An image processing method, comprising:

any one of recording an image on a thermally reversible recording medium that can reversibly change any one of its transparency and color tone depending on temperature by irradiating and heating the thermally reversible recording medium with a laser beam, and erasing the image recorded on the thermally reversible recording medium by heating the thermally reversible recording medium, wherein a laser emitting the laser beam is a $CO_2$ laser; and in the image recording, when the first and second auxiliary lines including an image line are continuously scanned from the start point of the first auxiliary line to the end point of the second auxiliary line, the image line is scanned with irradiating the laser beam, and the first auxiliary line and the second auxiliary line are scanned without irradiating the laser beam to thereby record the image.

16. The image processing method according to claim 15, wherein in any one of the image recording and the image erasing, at least one of a temperature of the thermally reversible recording medium and a peripheral temperature thereof is detected to control irradiation conditions of the laser beam to be radiated to the thermally reversible recording medium.

17. The image processing method according to claim 15, wherein a time used to scan the first auxiliary line and the second auxiliary line in a state where the laser beam is not irradiated is 0.2 ms to 5 ms.

18. The image processing method according to claim 15, wherein each of the image lines constituting the image is a line constituting any one of a character, a symbol and a diagram.

19. The image processing method according to claim 15, wherein the thermally reversible recording medium has at least a thermally reversible recording layer on a substrate and reversibly changes any one of its transparency and color tone at between a first specific temperature and a second specific temperature that is higher than the first specific temperature.

20. The image processing method according to claim 15, wherein the thermally reversible recording medium has at least a reversible thermosensitive recording layer on a substrate, and the reversible thermosensitive recording layer comprises a resin and an organic low-molecular material.

21. The image processing method according to claim 15, wherein the thermally reversible recording medium has at least a reversible thermosensitive recording layer on a substrate, and the reversible thermosensitive recording layer comprises a leuco dye and a reversible developer.

22. The image processor according to claim 1, wherein said 80% light energy bordering surface corresponds to a first plane separating a three-dimensional representation of the light intensity of the irradiated laser beam, such that 80% of the total light energy of the irradiated laser beam is present between said first plane and a second plane corresponding to a surface of the thermally reversible recording medium.

23. The image processor according to claim 8, wherein the recording of the start point and the end point of each of the image lines is performed in a state wherein the scanning speed of the laser beam is at a speed of ½ to ⅔ times the uniform motion speed.

* * * * *